United States Patent
Xu et al.

(10) Patent No.: US 11,394,491 B2
(45) Date of Patent: Jul. 19, 2022

(54) NESTED STRUCTURE FOR POLAR CODE CONSTRUCTION USING DENSITY EVOLUTION

(71) Applicant: QUALCOMM Incorporated, San Diego, CA (US)

(72) Inventors: Changlong Xu, Beijing (CN); Gaojin Wu, Beijing (CN); Thomas Richardson, South Orange, NJ (US); Jilei Hou, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/473,572

(22) PCT Filed: Jul. 6, 2017

(86) PCT No.: PCT/CN2017/091947
§ 371 (c)(1),
(2) Date: Jun. 25, 2019

(87) PCT Pub. No.: WO2018/120734
PCT Pub. Date: Jul. 5, 2018

(65) Prior Publication Data
US 2019/0372713 A1    Dec. 5, 2019

(30) Foreign Application Priority Data
Dec. 29, 2016 (WO) ............... PCT/CN2016/113031

(51) Int. Cl.
*H04L 1/00* (2006.01)
*H04L 1/22* (2006.01)

(52) U.S. Cl.
CPC ......... *H04L 1/0061* (2013.01); *H04L 1/0041* (2013.01); *H04L 1/0068* (2013.01); *H04L 1/22* (2013.01)

(58) Field of Classification Search
None
See application file for complete search history.

(56) References Cited

U.S. PATENT DOCUMENTS

2015/0194987 A1* 7/2015 Li .................. H04L 1/0057
714/752
2015/0333775 A1 11/2015 Korb et al.
(Continued)

FOREIGN PATENT DOCUMENTS

CN    101072082 A    11/2007
CN    103023618 A    4/2013
(Continued)

OTHER PUBLICATIONS

International Search Report and Written Opinion—PCT/CN2016/113031—ISA/EPO—dated Sep. 27, 2017.
(Continued)

*Primary Examiner* — Peter Chen
*Assistant Examiner* — Jeff Banthrongsack
(74) *Attorney, Agent, or Firm* — Loza & Loza, LLP

(57) ABSTRACT

Aspects of the disclosure relate to wireless communication devices configured to generate polar codewords utilizing a single master sequence constructed using density evolution with a nested structure for identifying the frozen bit locations and information bit locations. This single master sequence may be used for any codeword length N up to a maximum codeword length Nmax, and may further be utilized for any code rate R. For example, from the master sequence of length Nmax, a bit location sequence S with codeword length N (where N<Nmax) may be obtained by selecting the bit locations (indexes) in the master sequence corresponding to each bit location in S in the order provided in the master sequence.

24 Claims, 11 Drawing Sheets

(56) References Cited

U.S. PATENT DOCUMENTS

| | | | |
|---|---|---|---|
| 2016/0013810 | A1 | 1/2016 | Gross et al. |
| 2016/0013887 | A1 | 1/2016 | Shen et al. |
| 2016/0164629 | A1 | 6/2016 | Ahn et al. |
| 2016/0182187 | A1 | 6/2016 | Kim et al. |
| 2016/0204811 | A1 | 7/2016 | Goela et al. |
| 2016/0285479 | A1 | 9/2016 | El-Khamy et al. |

FOREIGN PATENT DOCUMENTS

| | | | |
|---|---|---|---|
| CN | 103368583 | A | 10/2013 |
| CN | 103684477 | A | 3/2014 |
| CN | 105811998 | A | 7/2016 |
| CN | 105900365 | A | 8/2016 |
| CN | 106230489 | A | 12/2016 |
| JP | 2019528008 | A | 10/2019 |
| WO | 2015066925 | A1 | 5/2015 |
| WO | 2016172937 | A1 | 11/2016 |

OTHER PUBLICATIONS

International Search Report and Written Opinion—PCT/CN2017/091947—ISA/EPO—dated Sep. 29, 2017.

Deng R., et al., "On the Polar Code Encoding in Fading Channels", Cornell University Library, 201 Olin Library Cornell University Ithaca, NY 1485310, Mar. 8, 2016 (Mar. 8, 2016), pp. 1-5, XP80687855, Retrieved from the Internet: URL: https://arxiv.org/pdf/1603.02365v1.pdf, section IV. Non-Universality of Polar Codes.

Huawei et al., "Polar Code Design and Rate Matching", 3GPP Draft, 3GPP TSG RAN WG1 Meeting #86, R1-167209 Polar Code Design and Rate-Matching, 3rd Generation Partnership Project (3GPP), Mobile Competence Centre, 650, Route Des Lucioles, F-06921 Sophia-Antipolis Cedex, France, vol. RAN WG1, No. Gothenburg, Sweden, Aug. 22, 2016-Aug. 26, 2016 Aug. 13, 2016 (Aug. 13, 2016), XP051142532, 5 Pages, Retrieved from the Internet: URL:http://www.3gpp.org/ftp/tsg_ran/WG1_RL1/TSGR1_86/Docs/[retrieved on Aug. 13, 2016].

Supplementary European Search Report—EP17886982—Search Authority—Munich—dated Jul. 9, 2020.

Vangala H., et al., "A Comparative Study of Polar Code Constructions for the AWGN Channel", arXiv:1501.02473v1, Jan. 11, 2015 (Jan. 11, 2015), XP055438365, pp. 1-9, Retrieved from the Internet: URL:https://arxiv.org/pdf/1501.02473.pdf [retrieved on Jan. 5, 2018] section "IV. Non-Universality of PolarCodes".

Tianguang H., et al., "An Efficient and Low-Complexity Encoding and Decoding Algorithm of Polar Code", Electronic Technology Application 5G Key Technology and Algorithm Implementation, vol. 42, No. 7, Jul. 29, 2016, 5 pages.

Wang R., et al., "A Novel Puncturing Scheme for Polar Codes", IEEE Communications Letters, IEEE Service Center, Piscataway, NJ, US, vol. 18, No. 12, Dec. 31, 2014 (Dec. 31, 2014), pp. 2081-2084, XP011567208, ISSN: 1089-7798, DOI: 10.1109/LCOMM.2014.2364845 [retrieved on Dec. 8, 2014].

* cited by examiner

NESTED STRUCTURE FOR POLAR CODE CONSTRUCTION USING DENSITY EVOLUTION

CROSS-REFERENCE TO RELATED APPLICATION(S)

This application is the U.S. national stage of PCT patent application number PCT/CN2017/091947 filed on Jul. 6, 2017, which claims priority to and the benefit of PCT patent application number PCT/CN2016/113031 filed on Dec. 29, 2016, the content of each of which is incorporated herein by reference.

TECHNICAL FIELD

The technology discussed below relates generally to wireless communication systems, and more particularly, to channel coding utilizing polar codes in wireless communication systems. Embodiments can provide techniques for generating polar codewords utilizing a single master sequence constructed using density evolution with a nested structure.

BACKGROUND

Block codes, or error correcting codes, are frequently used to provide reliable transmission of digital messages over noisy channels. In a typical block code, an information message or sequence is split up into blocks, and an encoder at the transmitting device then mathematically adds redundancy to the information message. Exploitation of this redundancy in the encoded information message is the key to the reliability of the message, enabling correction for any bit errors that may occur due to noise. That is, a decoder at the receiving device can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for future networks, a new category of block codes, called polar codes, presents a potential opportunity for reliable and efficient information transfer with improved performance relative to turbo codes and LDPC codes.

While research into implementation of polar codes continues to rapidly advance its capabilities and potential, additional enhancements are desired, particularly for potential deployment of future wireless communication networks beyond LTE.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Various aspects of the disclosure provide for the generation of polar codewords utilizing a single master sequence constructed using density evolution with a nested structure for identifying the frozen bit locations and information bit locations. This single master sequence may be used for any codeword length N up to a maximum codeword length $N_{max}$, and may further be utilized for any code rate R. For example, from the master sequence of length $N_{max}$, a bit location sequence S with codeword length N (where $N<N_{max}$) may be obtained by selecting the bit locations (indexes) in the master sequence corresponding to each bit location in S in the order provided in the master sequence.

In one aspect of the disclosure, a method of polar coding at a transmitting wireless communication device is provided. The method includes accessing a master sequence of final bit locations maintained in order of reliability, where the master sequence is generated utilizing density evolution and nested over a code rate vector including a plurality of code rates having a same rate level, and the master sequence includes a maximum length. The method further includes generating a bit location sequence from the master sequence for an information block including a block length less than the maximum length, where the bit location sequence includes a number of the final bit locations corresponding to the block length arranged in order of reliability according to the master sequence. The method further includes identifying information bit locations and frozen bit locations in the information block based on the bit location sequence, placing information bits in the information bit locations of the information block and frozen bits in the frozen bit locations of the information block, polar coding the information block to produce a polar codeword, and transmitting the polar codeword to a receiving wireless communication device over a wireless air interface.

Another aspect of the disclosure provides an apparatus configured for polar coding. The apparatus includes a transceiver, a memory, and a processor communicatively coupled to the transceiver and the memory. The memory is configured to store a master sequence of final bit locations maintained in order of reliability, where the master sequence is generated utilizing density evolution and nested over a code rate vector including a plurality of code rates having a same rate level, and the master sequence includes a maximum length. The processor is configured to generate a bit location sequence from the master sequence for an information block including a block length less than the maximum length, where the bit location sequence includes a number of the final bit locations corresponding to the block length arranged in order of reliability according to the master sequence. The processor is further configured to identify information bit locations and frozen bit locations in the information block based on the bit location sequence, place information bits in the information bit locations of the information block and frozen bits in the frozen bit locations of the information block, polar code the information block to produce a polar codeword, and transmit the polar codeword to a receiving wireless communication device via the transceiver over a wireless air interface.

Another aspect of the disclosure provides an apparatus configured for polar coding. The apparatus includes means for accessing a master sequence of final bit locations maintained in order of reliability, where the master sequence is generated utilizing density evolution and nested over a code rate vector including a plurality of code rates having a same rate level, and the master sequence includes a maximum length. The apparatus further includes means for generating a bit location sequence from the master sequence for an information block including a block length less than the maximum length, where the bit location sequence includes a number of the final bit locations corresponding to the block length arranged in order of reliability according to the master sequence. The apparatus further includes means for identifying information bit locations and frozen bit locations in the information block based on the bit location sequence, means for placing information bits in the information bit locations of the information block and frozen bits in the frozen bit locations of the information block, means for polar coding the information block to produce a polar codeword, and means for transmitting the polar codeword to a receiving wireless communication device over a wireless air interface.

Another aspect of the disclosure provides a non-transitory computer-readable medium storing computer-executable code. The computer-executable code includes code for accessing a master sequence of final bit locations maintained in order of reliability, where the master sequence is generated utilizing density evolution and nested over a code rate vector including a plurality of code rates having a same rate level, and the master sequence includes a maximum length. The computer-executable code further includes code for generating a bit location sequence from the master sequence for an information block including a block length less than the maximum length, where the bit location sequence includes a number of the final bit locations corresponding to the block length arranged in order of reliability according to the master sequence. The computer-executable code further includes code for identifying information bit locations and frozen bit locations in the information block based on the bit location sequence, placing information bits in the information bit locations of the information block and frozen bits in the frozen bit locations of the information block, polar coding the information block to produce a polar codeword, and transmitting the polar codeword to a receiving wireless communication device over a wireless air interface.

Examples of additional aspects of the disclosure follow. In some aspects of the present disclosure, to identify the information bit locations and the frozen bit locations in the information block, a first number of original bit locations of the information block may be identified as the information bit locations based on a code rate and the bit location sequence, and a remaining number of the original bit locations of the information block may be identified as the frozen bit locations, where each of the information bit locations may have a higher reliability than each of the frozen bit locations based on the bit location sequence.

In some aspects of the present disclosure, the final bit locations include each of the original bit locations of the information block. To generate the bit location sequence from the master sequence for the information block, each of the original bit locations may be selected from the master sequence in order to produce the bit location sequence, where the original bit locations are arranged in the order of reliability of the master sequence in the bit location sequence.

In some aspects of the present disclosure, to identify the information bit locations and the frozen bit locations in the information block an initial puncturing pattern including initial punctured bit locations may be generated for puncturing corresponding coded bit locations in the polar codeword. A bit-reversal permutation may then be performed on the initial puncturing pattern to produce a final puncturing pattern including final punctured bit locations and frozen bits may be placed in the final punctured bit locations of the information block. The information bit locations and frozen bit locations may then be identified in the information block from non-punctured bit locations in the information block based on the bit location sequence.

In some aspects of the present disclosure, the master sequence includes a first final bit location having a highest reliability and a last final bit location having a lowest reliability. In other aspects of the present disclosure, the master sequence includes a first final bit location having a lowest reliability and a last final bit location having a highest reliability.

These and other aspects of the invention will become more fully understood upon a review of the detailed description, which follows. Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Figure 1:
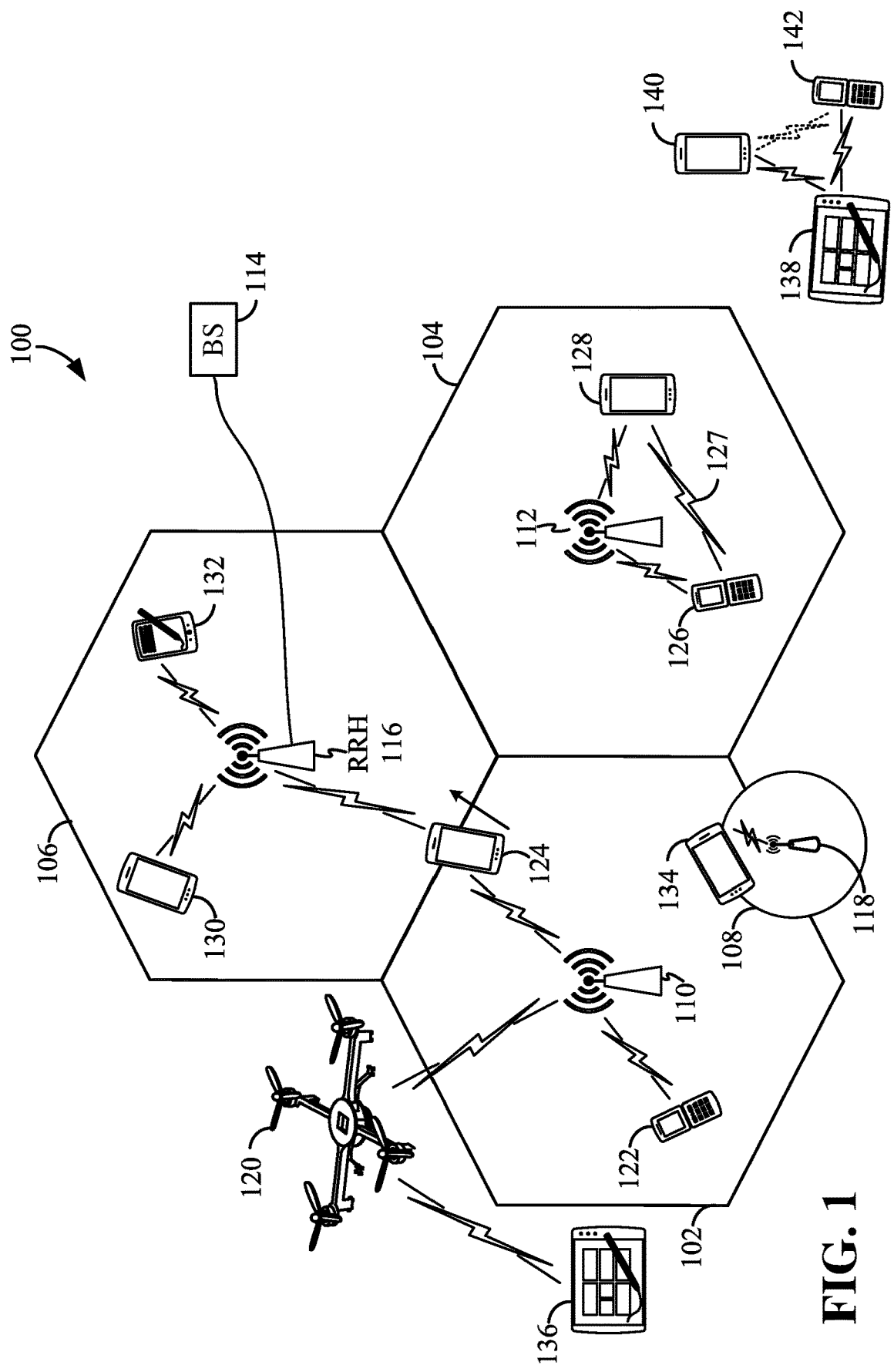
FIG. 1 is a diagram illustrating an example of a radio access network.

The various concepts presented throughout this disclosure may be implemented across a broad variety of telecommunication systems, network architectures, and communication standards. Referring now to FIG. 1, as an illustrative example without limitation, a schematic illustration of a radio access network 100 is provided. The radio access network 100 may be a next generation (e.g., fifth generation (5G) or New Radio (NR)) radio access network or a legacy (e.g., 3G or 4G) radio access network. In addition, one or more nodes in the radio access network 100 may be next generation nodes or legacy nodes.

As used herein, the term legacy radio access network refers to a network employing a third generation (3G) wireless communication technology based on a set of standards that complies with the International Mobile Telecommunications-2000 (IMT-2000) specifications or a fourth generation (4G) wireless communication technology based on a set of standards that comply with the International Mobile Telecommunications Advanced (ITU-Advanced) specification. For example, some the standards promulgated by the 3rd Generation Partnership Project (3GPP) and the 3rd Generation Partnership Project 2 (3GPP2) may comply with IMT-2000 and/or ITU-Advanced. Examples of such legacy standards defined by the 3rd Generation Partnership Project (3GPP) include, but are not limited to, Long-Term Evolution (LTE), LTE-Advanced, Evolved Packet System (EPS), and Universal Mobile Telecommunication System (UMTS). Additional examples of various radio access technologies based on one or more of the above-listed 3GPP standards include, but are not limited to, Universal Terrestrial Radio Access (UTRA), Evolved Universal Terrestrial Radio Access (eUTRA), General Packet Radio Service (GPRS) and Enhanced Data Rates for GSM Evolution (EDGE). Examples of such legacy standards defined by the 3rd Generation Partnership Project 2 (3GPP2) include, but are not limited to, CDMA2000 and Ultra Mobile Broadband (UMB). Other examples of standards employing 3G/4G wireless communication technology include the IEEE 802.16 (WiMAX) standard and other suitable standards.

As further used herein, the term next generation radio access network generally refers to a network employing continued evolved wireless communication technologies. This may include, for example, a fifth generation (5G) wireless communication technology based on a set of standards. The standards may comply with the guidelines set forth in the 5G White Paper published by the Next Generation Mobile Networks (NGMN) Alliance on Feb. 17, 2015. For example, standards that may be defined by the 3GPP following LTE-Advanced or by the 3GPP2 following CDMA2000 may comply with the NGMN Alliance 5G White Paper. Standards may also include pre-3GPP efforts specified by Verizon Technical Forum (www.vstgf) and Korea Telecom SIG (www.kt5g.org).

The geographic region covered by the radio access network 100 may be divided into a number of cellular regions (cells) that can be uniquely identified by a user equipment (UE) based on an identification broadcasted over a geographical area from one access point or base station. FIG. 1 illustrates macrocells 102, 104, and 106, and a small cell 108, each of which may include one or more sectors. A sector is a sub-area of a cell. All sectors within one cell are served by the same base station. A radio link within a sector can be identified by a single logical identification belonging to that sector. In a cell that is divided into sectors, the multiple sectors within a cell can be formed by groups of antennas with each antenna responsible for communication with UEs in a portion of the cell.

In general, a base station (BS) serves each cell. Broadly, a base station is a network element in a radio access network responsible for radio transmission and reception in one or more cells to or from a UE. A BS may also be referred to by those skilled in the art as a base transceiver station (BTS), a radio base station, a radio transceiver, a transceiver function, a basic service set (BSS), an extended service set (ESS), an access point (AP), a Node B (NB), an eNode B (eNB), a gNodeB (gNB) or some other suitable terminology.

In FIG. 1, two high-power base stations 110 and 112 are shown in cells 102 and 104; and a third high-power base station 114 is shown controlling a remote radio head (RRH) 116 in cell 106. That is, a base station can have an integrated antenna or can be connected to an antenna or RRH by feeder cables. In the illustrated example, the cells 102, 104, and 106 may be referred to as macrocells, as the high-power base stations 110, 112, and 114 support cells having a large size. Further, a low-power base station 118 is shown in the small cell 108 (e.g., a microcell, picocell, femtocell, home base station, home Node B, home eNode B, etc.) which may overlap with one or more macrocells. In this example, the cell 108 may be referred to as a small cell, as the low-power base station 118 supports a cell having a relatively small size. Cell sizing can be done according to system design as well as component constraints. It is to be understood that the radio access network 100 may include any number of wireless base stations and cells. Further, a relay node may be deployed to extend the size or coverage area of a given cell. The base stations 110, 112, 114, 118 provide wireless access points to a core network for any number of mobile apparatuses.

FIG. 1 further includes a quadcopter or drone 120, which may be configured to function as a base station. That is, in some examples, a cell may not necessarily be stationary, and the geographic area of the cell may move according to the location of a mobile base station such as the quadcopter 120.

In general, base stations may include a backhaul interface for communication with a backhaul portion of the network. The backhaul may provide a link between a base station and a core network, and in some examples, the backhaul may provide interconnection between the respective base stations. The core network is a part of a wireless communication system that is generally independent of the radio access technology used in the radio access network. Various types of backhaul interfaces may be employed, such as a direct physical connection, a virtual network, or the like using any suitable transport network. Some base stations may be configured as integrated access and backhaul (IAB) nodes, where the wireless spectrum may be used both for access links (i.e., wireless links with UEs), and for backhaul links. This scheme is sometimes referred to as wireless self-backhauling. By using wireless self-backhauling, rather than requiring each new base station deployment to be outfitted with its own hard-wired backhaul connection, the wireless spectrum utilized for communication between the base station and UE may be leveraged for backhaul communication, enabling fast and easy deployment of highly dense small cell networks.

The radio access network 100 is illustrated supporting wireless communication for multiple mobile apparatuses. A mobile apparatus is commonly referred to as user equipment (UE) in standards and specifications promulgated by the 3rd Generation Partnership Project (3GPP), but may also be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, or some other suitable terminology. A UE may be an apparatus that provides a user with access to network services.

Within the present document, a "mobile" apparatus need not necessarily have a capability to move, and may be stationary. The term mobile apparatus or mobile device broadly refers to a diverse array of devices and technologies. For example, some non-limiting examples of a mobile apparatus include a mobile, a cellular (cell) phone, a smart phone, a session initiation protocol (SIP) phone, a laptop, a personal computer (PC), a notebook, a netbook, a smartbook, a tablet, a personal digital assistant (PDA), and a broad array of embedded systems, e.g., corresponding to an "Internet of things" (IoT). A mobile apparatus may additionally be an automotive or other transportation vehicle, a remote sensor or actuator, a robot or robotics device, a satellite radio, a global positioning system (GPS) device, an object tracking device, a drone, a multi-copter, a quadcopter, a remote control device, a consumer and/or wearable device, such as eyewear, a wearable camera, a virtual reality device, a smart watch, a health or fitness tracker, a digital audio player (e.g., MP3 player), a camera, a game console, etc. A mobile apparatus may additionally be a digital home or smart home device such as a home audio, video, and/or multimedia device, an appliance, a vending machine, intelligent lighting, a home security system, a smart meter, etc. A mobile apparatus may additionally be a smart energy device, a security device, a solar panel or solar array, a municipal infrastructure device controlling electric power (e.g., a smart grid), lighting, water, etc.; an industrial automation and enterprise device; a logistics controller; agricultural equipment; military defense equipment, vehicles, aircraft, ships, and weaponry, etc. Still further, a mobile apparatus may provide for connected medicine or telemedicine support, i.e., health care at a distance. Telehealth devices may include telehealth monitoring devices and telehealth administration devices, whose communication may be given preferential treatment or prioritized access over other types of information, e.g., in terms of prioritized access for transport of critical service user data traffic, and/or relevant QoS for transport of critical service user data traffic.

Within the radio access network 100, the cells may include UEs that may be in communication with one or more sectors of each cell. For example, UEs 122 and 124 may be in communication with base station 110; UEs 126 and 128 may be in communication with base station 112; UEs 130 and 132 may be in communication with base station 114 by way of RRH 116; UE 134 may be in communication with low-power base station 118; and UE 136 may be in communication with mobile base station 120. Here, each base station 110, 112, 114, 118, and 120 may be configured to provide an access point to a core network (not shown) for all the UEs in the respective cells.

In another example, a mobile network node (e.g., quadcopter 120) may be configured to function as a UE. For example, the quadcopter 120 may operate within cell 102 by communicating with base station 110. In some aspects of the disclosure, two or more UE (e.g., UEs 126 and 128) may communicate with each other using peer to peer (P2P) or sidelink signals 127 without relaying that communication through a base station (e.g., base station 112).

Unicast or broadcast transmissions of control information and/or user data traffic from a base station (e.g., base station 110) to one or more UEs (e.g., UEs 122 and 124) may be referred to as downlink (DL) transmission, while transmissions of control information and/or user data traffic originating at a UE (e.g., UE 122) may be referred to as uplink (UL) transmissions. In addition, the uplink and/or downlink control information and/or user data traffic may be time-divided into frames, subframes, slots, mini-slots and/or symbols. As used herein, a symbol may refer to a unit of time that, in an orthogonal frequency division multiplexed (OFDM) waveform, carries one resource element (RE) per sub-carrier. A slot may carry 7 or 14 OFDM symbols. A mini-slot may carry less than 7 OFDM symbols or less than 14 OFDM symbols. A subframe may refer to a duration of 1 ms. Multiple subframes or slots may be grouped together to form a single frame or radio frame. Of course, these definitions are not required, and any suitable scheme for organizing waveforms may be utilized, and various time divisions of the waveform may have any suitable duration.

The air interface in the radio access network 100 may utilize one or more multiplexing and multiple access algorithms to enable simultaneous communication of the various devices. For example, multiple access for uplink (UL) or reverse link transmissions from UEs 122 and 124 to base station 110 may be provided utilizing time division multiple access (TDMA), code division multiple access (CDMA), frequency division multiple access (FDMA), orthogonal frequency division multiple access (OFDMA), sparse code multiple access (SCMA), single-carrier frequency division multiple access (SC-FDMA), resource spread multiple access (RSMA), or other suitable multiple access schemes. Further, multiplexing downlink (DL) or forward link transmissions from the base station 110 to UEs 122 and 124 may be provided utilizing time division multiplexing (TDM), code division multiplexing (CDM), frequency division multiplexing (FDM), orthogonal frequency division multiplexing (OFDM), sparse code multiplexing (SCM), single-carrier frequency division multiplexing (SC-FDM) or other suitable multiplexing schemes.

Further, the air interface in the radio access network 100 may utilize one or more duplexing algorithms. Duplex refers to a point-to-point communication link where both endpoints can communicate with one another in both directions. Full duplex means both endpoints can simultaneously communicate with one another. Half duplex means only one endpoint can send information to the other at a time. In a wireless link, a full duplex channel generally relies on physical isolation of a transmitter and receiver, and suitable interference cancellation technologies. Full duplex emulation is frequently implemented for wireless links by utilizing frequency division duplex (FDD) or time division duplex (TDD). In FDD, transmissions in different directions operate at different carrier frequencies. In TDD, transmissions in different directions on a given channel are separated from one another using time division multiplexing. That is, at some times the channel is dedicated for transmissions in one direction, while at other times the channel is dedicated for transmissions in the other direction, where the direction may change very rapidly, e.g., several times per subframe.

In the radio access network 100, the ability for a UE to communicate while moving, independent of their location, is referred to as mobility. The various physical channels between the UE and the radio access network are generally set up, maintained, and released under the control of an access and mobility management function (AMF), which may include a security context management function (SCMF) that manages the security context for both the control plane and the user plane functionality and a security anchor function (SEAF) that performs authentication. In various aspects of the disclosure, a radio access network 100 may utilize DL-based mobility or UL-based mobility to enable mobility and handovers (i.e., the transfer of a UE's connection from one radio channel to another). In a network configured for DL-based mobility, during a call with a scheduling entity, or at any other time, a UE may monitor various parameters of the signal from its serving cell as well as various parameters of neighboring cells. Depending on the quality of these parameters, the UE may maintain communication with one or more of the neighboring cells. During this time, if the UE moves from one cell to another, or if signal quality from a neighboring cell exceeds that from the serving cell for a given amount of time, the UE may undertake a handoff or handover from the serving cell to the neighboring (target) cell. For example, UE 124 may move from the geographic area corresponding to its serving cell 102 to the geographic area corresponding to a neighbor cell 106. When the signal strength or quality from the neighbor cell 106 exceeds that of its serving cell 102 for a given amount of time, the UE 124 may transmit a reporting message to its serving base station 110 indicating this condition. In response, the UE 124 may receive a handover command, and the UE may undergo a handover to the cell 106.

In a network configured for UL-based mobility, UL reference signals from each UE may be utilized by the network to select a serving cell for each UE. In some examples, the base stations 110, 112, and 114/116 may broadcast unified synchronization signals (e.g., unified Primary Synchronization Signals (PSSs), unified Secondary Synchronization Signals (SSSs) and unified Physical Broadcast Channels (PBCH)). The UEs 122, 124, 126, 128, 130, and 132 may receive the unified synchronization signals, derive the carrier frequency and subframe timing from the synchronization signals, and in response to deriving timing, transmit an uplink pilot or reference signal. The uplink pilot signal transmitted by a UE (e.g., UE 124) may be concurrently received by two or more cells (e.g., base stations 110 and 114/116) within the radio access network 100. Each of the cells may measure a strength of the pilot signal, and the radio access network (e.g., one or more of the base stations 110 and 114/116 and/or a central node within the core network) may determine a serving cell for the UE 124. As the UE 124 moves through the radio access network 100, the network may continue to monitor the uplink pilot signal transmitted by the UE 124. When the signal strength or quality of the pilot signal measured by a neighboring cell exceeds that of the signal strength or quality measured by the serving cell, the network 100 may handover the UE 124 from the serving cell to the neighboring cell, with or without informing the UE 124.

Although the synchronization signal transmitted by the base stations 110, 112, and 114/116 may be unified, the synchronization signal may not identify a particular cell, but rather may identify a zone of multiple cells operating on the same frequency and/or with the same timing. The use of zones in 5G networks or other next generation communication networks enables the uplink-based mobility framework and improves the efficiency of both the UE and the network, since the number of mobility messages that need to be exchanged between the UE and the network may be reduced.

In various implementations, the air interface in the radio access network 100 may utilize licensed spectrum, unlicensed spectrum, or shared spectrum. Licensed spectrum provides for exclusive use of a portion of the spectrum, generally by virtue of a mobile network operator purchasing a license from a government regulatory body. Unlicensed spectrum provides for shared use of a portion of the spectrum without need for a government-granted license. While compliance with some technical rules is generally still required to access unlicensed spectrum, generally, any operator or device may gain access. Shared spectrum may fall between licensed and unlicensed spectrum, wherein technical rules or limitations may be required to access the spectrum, but the spectrum may still be shared by multiple operators and/or multiple RATs. For example, the holder of a license for a portion of licensed spectrum may provide licensed shared access (LSA) to share that spectrum with other parties, e.g., with suitable licensee-determined conditions to gain access.

In some examples, access to the air interface may be scheduled, wherein a scheduling entity (e.g., a base station) allocates resources (e.g., time-frequency resources) for communication among some or all devices and equipment within its service area or cell. Within the present disclosure, as discussed further below, the scheduling entity may be responsible for scheduling, assigning, reconfiguring, and releasing resources for one or more scheduled entities. That is, for scheduled communication, scheduled entities utilize resources allocated by the scheduling entity.

Base stations are not the only entities that may function as a scheduling entity. That is, in some examples, a UE may function as a scheduling entity, scheduling resources for one or more scheduled entities (e.g., one or more other UEs). In other examples, sidelink signals may be used between UEs without necessarily relying on scheduling or control information from a base station. For example, UE 138 is illustrated communicating with UEs 140 and 142. In some examples, the UE 138 is functioning as a scheduling entity or a primary sidelink device, and UEs 140 and 142 may function as a scheduled entity or a non-primary (e.g., secondary) sidelink device. In still another example, a UE may function as a scheduling entity in a device-to-device (D2D), peer-to-peer (P2P), or vehicle-to-vehicle (V2V) network, and/or in a mesh network. In a mesh network example, UEs 140 and 142 may optionally communicate directly with one another in addition to communicating with the scheduling entity 138.

Figure 2:
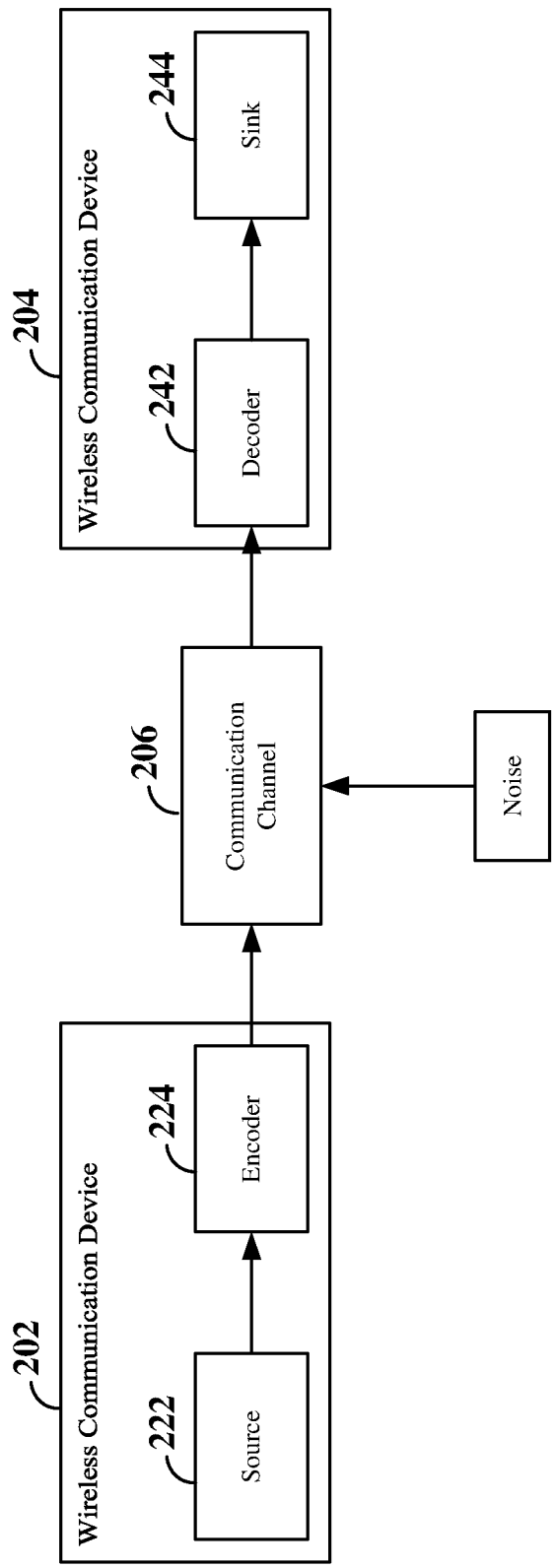
FIG. 2 is a schematic illustration of wireless communication utilizing block codes according to some aspects of the disclosure.

FIG. 2 is a schematic illustration of wireless communication between a first wireless communication device 202 and a second wireless communication device 204. Each wireless communication device 202 and 204 may be a user equipment (UE), a base station, or any other suitable apparatus or means for wireless communication. In the illustrated example, a source 222 within the first wireless communication device 202 transmits a digital message over a communication channel 206 (e.g., a wireless channel) to a sink 244 in the second wireless communication device 204. One issue in such a scheme that must be addressed to provide for reliable communication of the digital message, is to take into account the noise that affects the communication channel 206.

Block codes, or error correcting codes are frequently used to provide reliable transmission of digital messages over such noisy channels. In a typical block code, an information message or sequence is split up into blocks, each block having a length of K bits. An encoder 224 at the first (transmitting) wireless communication device 202 then mathematically adds redundancy to the information message, resulting in codewords having a length of N, where N>K. Here, the coding rate R is the ratio between the message length and the block length: i.e., R=K/N. Exploitation of this redundancy in the encoded information message is the key to reliability of the message, enabling correction for any bit errors that may occur due to the noise. That is, a decoder 242 at the second (receiving) wireless communication device 204 can take advantage of the redundancy to reliably recover the information message even though bit errors may occur, in part, due to the addition of noise to the channel.

Many examples of such error correcting block codes are known to those of ordinary skill in the art, including Hamming codes, Bose-Chaudhuri-Hocquenghem (BCH) codes, turbo codes, and low-density parity check (LDPC) codes, among others. Many existing wireless communication networks utilize such block codes, such as 3GPP LTE networks, which utilize turbo codes; and IEEE 802.11n Wi-Fi networks, which utilize LDPC codes. However, for future networks, a new category of block codes, called polar codes, presents a potential opportunity for reliable and efficient information transfer with improved performance relative to turbo codes and LDPC codes.

Polar codes are linear block error correcting codes. In general terms, channel polarization is generated with a recursive algorithm that defines polar codes. Polar codes are the first explicit codes that achieve the channel capacity of symmetric binary-input discrete memoryless channels. That is, polar codes achieve the channel capacity (the Shannon limit) or the theoretical upper bound on the amount of error-free information that can be transmitted on a discrete memoryless channel of a given bandwidth in the presence of noise.

Polar codes may be considered as block codes (N, K). The codeword length N is a power of 2 (e.g., 256, 512, 1024, etc.) because the original construction of a polarizing matrix is based on the Kronecker product of $$\begin{bmatrix} 1 & 0 \\ 1 & 1 \end{bmatrix}.$$

For example, an original information block may be represented as an information bit vector $u=(u_1, u_2, \ldots, u_N)$. The polar encoder 224 may polar code the information bit vector to produce the polar codeword as an encoded bit vector $c=(c_1, c_2, \ldots, c_N)$ using a generating matrix $G_N = B_N F^{\otimes n}$, where $B_N$ is the bit-reversal permutation matrix for successive cancellation (SC) decoding (functioning in some ways similar to the interleaver function used by a turbo coder in LTE networks) and $F^{\otimes n}$ is the $n^{th}$ Kronecker power of F. The basic matrix F may be represented as $$\begin{bmatrix} 1 & 0 \\ 1 & 1 \end{bmatrix}.$$

The matrix $F^{\otimes n}$ is generated by raising the basic 2×2 matrix F by the $n^{th}$ Kronecker power. This matrix is a lower triangular matrix, in that all the entries above the main diagonal are zero. For example, the matrix of $F^{\otimes n}$ may be expressed as:

$$F^{\otimes n} = \begin{bmatrix} 1 & 0 & 0 & & 0 & 0 & 0 & 0 \\ 1 & 1 & 0 & \ldots & 0 & 0 & 0 & 0 \\ 1 & 0 & 1 & & 0 & 0 & 0 & 0 \\ \vdots & & & \ddots & & & \vdots \\ 1 & 0 & 0 & & 1 & 0 & 0 & 0 \\ 1 & 1 & 0 & \ldots & 1 & 1 & 0 & 0 \\ 1 & 0 & 1 & & 1 & 0 & 1 & 0 \\ 1 & 1 & 1 & & 1 & 1 & 1 & 1 \end{bmatrix}$$

The polar encoder 224 may then generate the polar codeword as:

$$c_1^N = u_1^N G_N = u_1^N B_N F^{\otimes n}$$

Thus, the information bit vector u may include a number (N) of original bits that may be polar coded by the generating matrix $G_N$ to produce a corresponding number (N) of coded bits in the polar codeword c. In some examples, the information bit vector u may include a number of information bits, denoted K, and a number of frozen bits, denoted $F$. Frozen bits are bits that are set to a suitable predetermined value, such as 0 or 1. Thus, the value of the frozen bits may generally be known at both the transmitting device and the receiving device. The polar encoder 224 may determine the number of information bits and the number of frozen bits based on the code rate R. For example, the polar encoder 224 may select a code rate R from a set of one or more code rates and select K=N×R bits in the information block to transmit information. The remaining (N−K) bits in the information block may then be fixed as frozen bits $F$.

In order to determine which information block bits to set as frozen bits, the polar encoder 224 may further analyze the wireless channel over which the polar codeword may be sent. For example, the wireless channel for transmitting the polar codeword may be divided into a set of sub-channels, such that each encoded bit in the polar codeword is transmitted over one of the sub-channels. Thus, each sub-channel may correspond to a particular coded bit location in the polar codeword (e.g., sub-channel-1 may correspond to coded bit location containing coded bit $c_1$). The polar encoder 224 may identify the K best sub-channels (e.g., most reliable sub-channels) for transmitting the information bits and determine the original bit locations in the information block contributing to (or corresponding to) the K best sub-channels. For example, based on the generating matrix, one or more of the original bits of the information block may contribute to each of the coded bits of the polar codeword. Thus, based on the generating matrix, the polar encoder 224 may determine K original bit locations in the information block corresponding to the K best sub-channels, designate the K original bit locations in the information block for information bits and designate the remaining original bit locations in the information block for fixed bits.

In some examples, the polar encoder 224 may determine the K best sub-channels by performing Gaussian approximation. Gaussian approximation is generally known to those skilled in the art. In general, the polar encoder 224 may perform Gaussian approximation to calculate a respective log likelihood ratio (LLR) for each of the original bit locations. For example, the LLRs of the coded bit locations are known from the sub-channel conditions (e.g., based on the respective SNRs of the sub-channels). Thus, since one or more of the original bits of the information block may contribute to each of the coded bits of the polar codeword, the LLRs of each of the original bit locations may be derived from the known LLRs of the coded bit locations by performing Gaussian approximation. Based on the calculated original bit location LLRs, the polar encoder 224 may sort the sub-channels and select the K best sub-channels (e.g., "good" sub-channels) to transmit the information bits.

The polar encoder 224 may then set the original bit locations of the information block corresponding to the K best sub-channels as including information bits and the remaining original bit locations corresponding to the N–K sub-channels (e.g., "bad" sub-channels) as including frozen bits. Bit-reversal permutation may then be performed by applying the bit-reversal permutation matrix $B_N$ described above to the N bits (including K information bits and N–K frozen bits) to produce a bit-reversed information block. The bit-reversal permutation effectively re-orders the bits of the information block. The bit-reversed information block may then be polar coded by the generating matrix $G_N$ to produce a corresponding number (N) of coded bits in the polar codeword. The polar encoder 224 may then transmit the polar codeword to the receiving wireless communication device 204.

The receiving wireless communication device 204 receives a noisy version of c, and the decoder 242 has to decode c or, equivalently, u, using a simple successive cancellation (SC) decoding algorithm. Successive cancellation decoding algorithms typically have a decoding complexity of O (N log N) and can achieve Shannon capacity when N is very large. However, for short and moderate block lengths, the error rate performance of polar codes significantly degrades.

Therefore, in some examples, the polar decoder 242 may utilize a SC-list decoding algorithm to improve the polar coding error rate performance With SC-list decoding, instead of only keeping one decoding path (as in simple SC decoders), L decoding paths are maintained, where L>1. At each decoding stage, the polar decoder 242 discards the least probable (worst) decoding paths and keeps only the L best decoding paths. For example, instead of selecting a value $u_i$ at each decoding stage, two decoding paths corresponding to either possible value of $u_i$ are created and decoding is continued in two parallel decoding threads (2*L). To avoid the exponential growth of the number of decoding paths, at each decoding stage, only the L most likely paths are retained. At the end, the polar decoder 242 will have a list of L candidates for $u_1^N$, out of which the most likely candidate is selected. Thus, when the polar decoder 242 completes the SC-list decoding algorithm, the polar decoder 242 returns a single information block to the sink 244.

Since Gaussian approximation (GA) is a complex operation, it is difficult to perform in real-time. Therefore, GA bit location sequences in ascending or descending order of reliability are often calculated off-line and stored in memory for use in determining the information bit and frozen bit locations for an information block to be polar coded. However, storing multiple GA sequences, one for each possible code rate and information block size, requires a significant amount of memory.

Therefore, in various aspects of the disclosure, a single master sequence of bit locations in order of reliability (e.g., from low reliability to high reliability) may be generated using density evolution based on a nested structure for bit location selection. Density evolution is generally known to those skilled in the art, and therefore the details thereof are not described herein.

This single master sequence may be used for any codeword length N up to a maximum codeword length $N_{max}$, and may further be utilized for any code rate R. For example, from the master sequence of length $N_{max}$, a bit location sequence S with codeword length N (where N<$N_{max}$) may be obtained by selecting the bit locations (indexes) in the master sequence corresponding to each bit location in S in the order listed in the master sequence. As an example, for a codeword length of 8, bit locations 0 . . . 7 may be selected from the master sequence in the order listed in the master sequence.

In some examples, the single master sequence may be constructed using a nested structure of bit location selections based on the density evolution of the bit locations over a range of signal-to-noise ratios (SNRs). For example, density evolution may be performed to calculate the bit error probability (BEP) of each bit location within a codeword of length $N_{max}$ for each SNR within a range of SNRs. The range of SNRs may include a maximum and minimum SNR with a step size between each SNR within the range. For example, an SNR range of –20 dB to 20 dB with a step size of 0.5 dB may be utilized. It should be understood that any suitable range of SNRs and suitable step size within the range of SNRs may be chosen. At each SNR (e.g., SNR of –20 dB, SNR of –19.5 dB . . . SNR of 19.5 dB, SNR of 20 dB), the BEP may be calculated for each bit location (0 . . . $N_{max}$–1) to produce a table of BEP sequences. The table may include a number of rows corresponding to the number of SNR values within the range of SNRs and a number of columns corresponding to the maximum codeword length $N_{max}$. Thus, each row corresponds to a particular SNR value and each column corresponds to a particular bit location (0 . . . $N_{max}$) in the codeword of length $N_{max}$.

Based on $N_{max}$, a suitable code rate vector R, each with same rate level m (e.g., code rate denominator) may be chosen such that 1<m<$N_{max}$. In general, for any selected value of m, the code rate vector R may be expressed as $$\left(\frac{1}{m}, \frac{2}{m}, \cdots \frac{m-1}{m}\right).$$

For example, for a maximum codeword length $N_{max}$ of 2048, a rate level m of 32 may be chosen, such that the code rate vector $$R = \left(\frac{1}{32}, \frac{2}{32}, \cdots \frac{31}{32}\right).$$

For each code rate $R_i$ within the code rate vector R, an optimal BEP sequence within the table of BEP sequences may be obtained. The optimal BEP sequence for a particular code rate $R_i$ is chosen by selecting the $K_i$ best (most reliable or smallest BEP value) bit locations within each SNR row, where $K_i$=$N_{max}$ $R_i$. Then, for each SNR row, the block error rate (BLER) is calculated based on the BEPs of the $K_i$ best bit locations in that SNR row (e.g., as a sum of the BEPs of the $K_i$ best bit locations). The SNR row having a BLER value nearest to 0.01 may then be selected as the optimal SNR row with the optimal BEP sequence for that particular code rate $R_i$. This process may be iteratively performed for each code rate $R_i$ within the code rate vector R to select m–1 optimal BEP sequences (e.g., m–1 optimal SNR rows), one for each code rate $R_i$.

For simplicity, assume that m=4 and $N_{max}$=8. In this example, three (m–1) SNR rows may be selected as containing the optimal BEP sequences for each of the three code rates within the code rate vector R. For example, to select the SNR row (BEP sequence) for the first code rate ¼ in the code rate vector R, the two bit locations (e.g., $R_i N_{max}$ or ¼*8=2) in each SNR row with the best reliability (lowest BEP) may be selected. The BLER may then be calculated for each SNR row based on the two selected bit locations in that SNR row. The SNR row having a BLER value nearest 0.01 may then be selected as the optimal SNR row with the optimal BEP sequence for the code rate of ¼. This process may then be repeated for the other code rates of ²⁄₄ and ¾.

Once the m−1 optimal BEP sequences (e.g., optimal SNR rows) have been selected, the master sequence may be constructed using a nested selection of bit locations (indexes) between the optimal SNR rows. In some examples, again using the code rate vector R with a rate level of m, the optimal SNR row for the first (lowest) code rate $R_1$ in the code rate vector R may be identified from the previous calculation and the $K_1$ bit locations (indexes in the table) having the lowest BEP (highest reliability) may be selected as the first two bit locations in the master sequence. Then, the optimal SNR row for the next lowest code rate $R_2$ is utilized to select the next bit locations (indexes in the table) for the master sequence. For example, in the optimal SNR row for $R_2$, the bit locations corresponding to the ones selected for $R_1$ are retained (excluded from consideration), and the $K_2-K_1$ bit locations (indexes in the SNR row for $R_2$ of the table) with the lowest BEP (highest reliability) are selected for inclusion in the master sequence. This process continues until all bit locations (0 . . . $N_{max}-1$) are selected for inclusion in the master sequence. Thus, the master sequence is nested over R.

Using the simple example given above for m=4 and $N_{max}=8$, the optimal SNR row (BEP sequence) for the first code rate of ¼ is used to select the first two bit locations (e.g., $R_1 N_{max}=K_1$ or ¼*8=2) in the master sequence. Assuming that bit location 4 has the lowest BEP and bit location 3 has the next lowest BEP in that SNR row, the first two bit locations (indexes) in the master sequence would be 4 and 3. Then, from the optimal SNR row (BEP sequence) corresponding to the code rate of ²⁄₄, the third and fourth bit locations are retained as the first two bit locations selected and the next two (e.g., $K_2-K_1$, where $K_2=$²⁄₄*8=4; and $K_1=2$) bit locations are selected from the remaining bit locations based on the BEP values in the remaining bit locations. In this example, assume that bit location 7 has the lowest BEP from the remaining bit locations and bit location 6 has the next lowest BEP. Thus, the master sequence would now be [4 3 7 6].

Next, from the optimal SNR row (BEP sequence) corresponding to the code rate of ¾, the third, fourth, sixth, and seventh bit locations are retained as the first four bit locations selected and the last four bit locations are selected from the remaining bit locations based on the BEP values in the remaining bit locations. In this example, assume that bit location 5 has the lowest BEP from the remaining bit locations, bit location 2 has the next lowest BEP, bit location 1 has the next lowest BEP, and bit location 0 has the next lowest BEP (highest BEP) in that SNR row. Thus, the master sequence would now be [4 3 7 6 5 2 1 0].

It should be understood that the master sequence can be represented in descending order of reliability, as indicated above, or in ascending order of reliability. Using the above example, to construct the master sequence in ascending order of reliability, the master sequence would be [0 1 2 5 6 7 3 4]. Unless otherwise indicated, a master sequence in ascending order of reliability will be assumed in the present disclosure.

In some examples, instead of constructing the master sequence from lowest BEP to highest BEP (e.g., from highest reliability to lowest reliability), the master sequence may be constructed from highest BEP to lowest BEP. In this example, the frozen bit locations are determined first, whereas when constructing the master sequence from lowest to highest BEP, the information bit locations are determined first. For example, again using the code rate vector R with a rate level of m, the optimal SNR row for the last (highest) code rate $R_{m-1}$ in the code rate vector R may be identified from the previous calculation and the $N_{max}(1-R_{m-1})$ or $(N_{max}-K_{m-1})$ bit locations (indexes in the table) having the highest BEP (lowest reliability) may be selected as the least reliable bit locations in the master sequence. Then, the optimal SNR row for the next highest code rate $R_{m-2}$ is utilized to select the next least reliable bit locations for the master sequence. For example, in the optimal SNR row for $R_{m-2}$, the bit locations corresponding to the ones selected for $R_{m-1}$ are retained (excluded from consideration), and the $N_{max}(R_{m-2}-R_{m-1})$ bit locations (indexes in the SNR row for $R_{m-2}$ of the table) with the highest BEP (lowest reliability) are selected for inclusion as the next least reliable in the master sequence. This process continues until all bit locations (0 . . . $N_{max}-1$) are selected for inclusion in the master sequence.

As discussed above, from the master sequence of length $N_{max}$, a bit location sequence S with codeword length N (where N<$N_{max}$) may be obtained by selecting the bit locations (indexes) in the master sequence corresponding to each bit location in S in the order listed in the master sequence. As an example, for a codeword length of 6, bit locations 0 . . . 5 may be selected from the master sequence in the order listed in the master sequence. Again, using the above simplified example of a master sequence having a maximum codeword length of 8, the bit location sequence for a codeword length N of 6 selected from this master sequence would be [0 1 2 5 3 4]. Assuming a code rate of ²⁄₃, the K best bit locations may be selected as information bits, where K=²⁄₃*6=4. In this example, bit locations 2, 5, 3, and 4 may be selected for carrying information bits, while the remaining bit locations (e.g., bit locations 0 and 1) may be selected as frozen bits.

Figure 3:
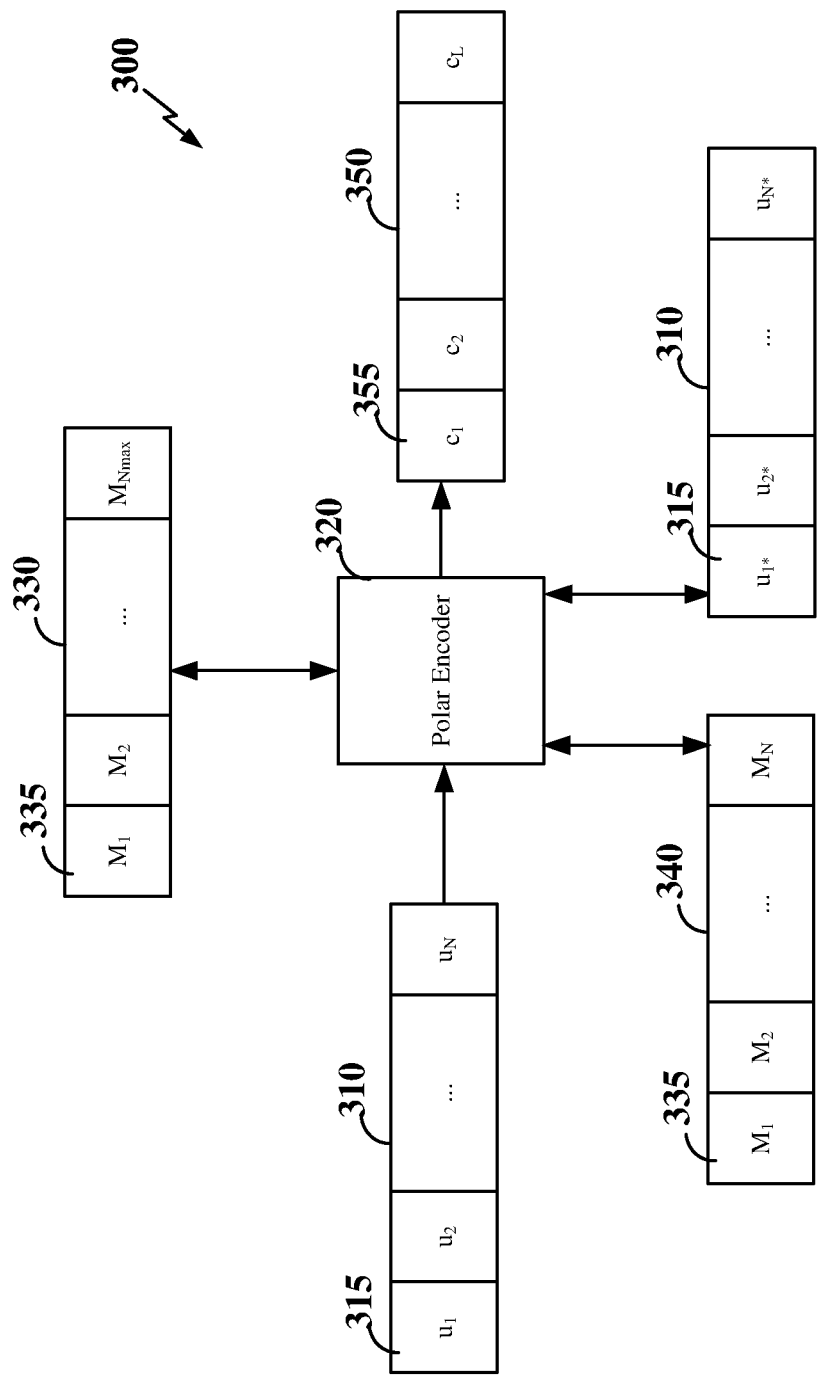
FIG. 3 is a diagram illustrating an example of polar coding and puncturing according to some aspects of the disclosure.

FIG. 3 is a diagram illustrating an example operation 300 of polar coding according to some embodiments. In FIG. 3, an information block 310 is provided including N original bit locations 315, each containing an original bit ($u_1$, $u_2$, . . . , $u_N$). Each of the original bits corresponds to an information bit or a frozen bit. The information block 310 is received by a polar encoder 320.

The polar encoder 320 further receives a master sequence 330 of final bit locations 335 ($M_1$, $M_2$, . . . $M_{Nmax}$) maintained in order of reliability (e.g., from low reliability to high reliability). From the master sequence 330 of length $N_{max}$, the polar encoder 320 may generate a bit location sequence 340 of length N, corresponding to the length of the information block 310 (where N<$N_{max}$), by selecting the bit locations 335 (indexes) in the master sequence 330 up to and including bit location $M_N$ in the order listed in the master sequence 330.

The polar encoder 320 may then identify the K original bit locations 315 in the information block 310 with the highest reliability based on the bit location sequence 340 and designate the K original bit locations 315 as information bit locations. The remaining original bit locations 315 (N−K) may be designated as frozen bit locations. The polar encoder may then place information bits in the information bit locations of the information block 310 and frozen bits in the frozen bit locations of the information block 310 to produce an ordered sequence of original bits ($u_{1*}, u_{2*}, \ldots, u_{N*}$). The ordered sequence of original bits contains the same bits as in the original information block 310, but re-ordered with the information bits placed in the information bit locations and the frozen bits placed in the frozen bit locations. The polar encoder 320 may then polar encode the information block 310 to produce a polar codeword 350 including N coded bit locations 355, each containing a coded bit ($c_1, c_2, \ldots, c_N$).

The above example also applies to polar encoders 320 that utilize puncturing. Puncturing is widely used to obtain length-compatible polar codes having a codeword whose block length is not a power of 2. For example, to obtain a 1000-bit code word length, 24 bits may be punctured from a $2^{10}=1024$-bit code word. According to various aspects of the present disclosure, puncturing may be utilized to obtain codewords of arbitrary length (e.g., lengths that are not necessarily a power of 2).

Figure 4:
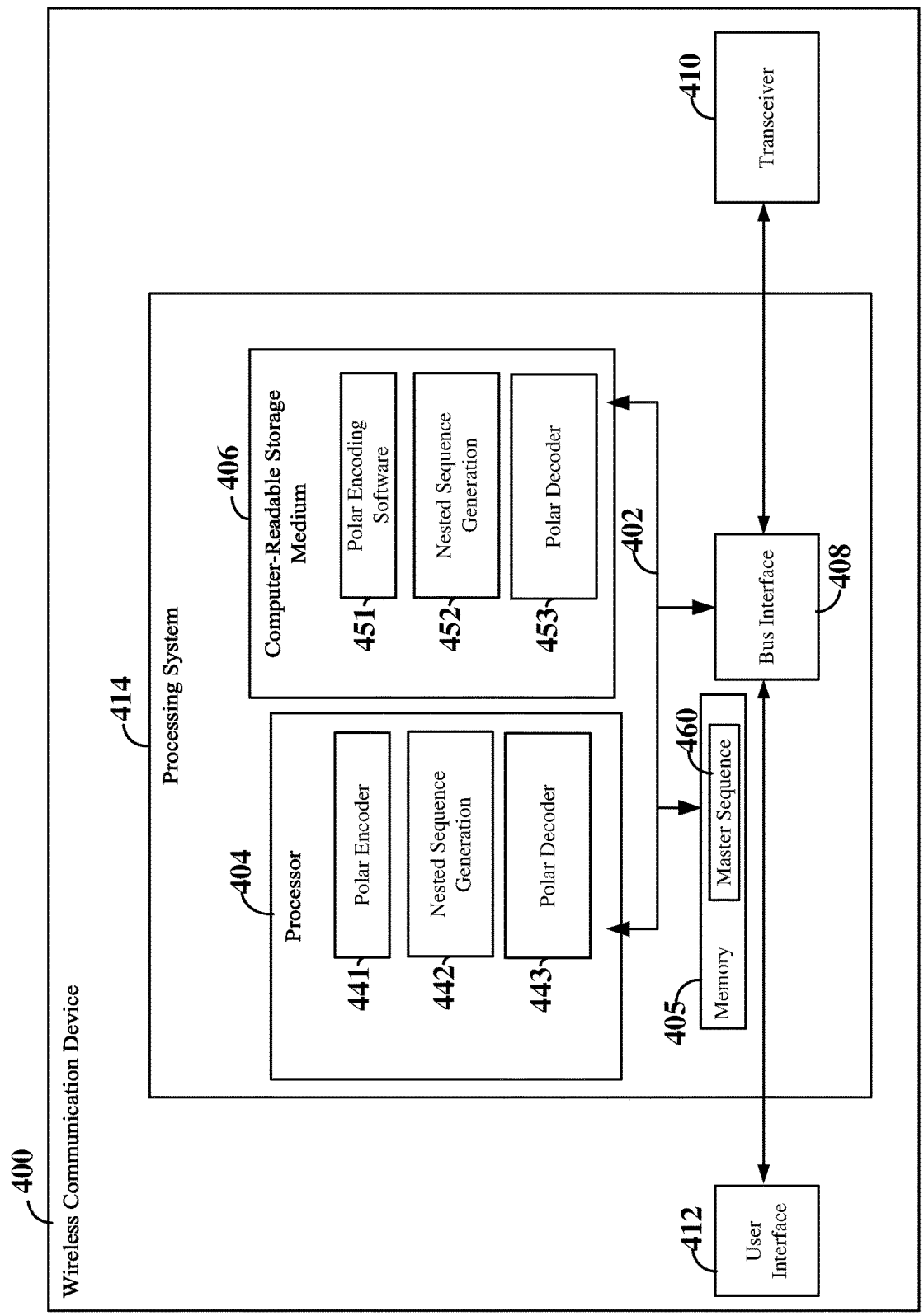
FIG. 4 is a block diagram illustrating an example of a hardware implementation for a wireless communication device employing a processing system according to some aspects of the disclosure.

FIG. 4 is a block diagram illustrating an example of a hardware implementation for a wireless communication device 400 employing a processing system 414. For example, the wireless communication device 400 may be a user equipment (UE), a base station, or any other suitable apparatus or means for wireless communication.

In accordance with various aspects of the disclosure, an element, or any portion of an element, or any combination of elements may be implemented with a processing system 414 that includes one or more processors 404. Examples of processors 404 include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. That is, the processor 404, as utilized in a wireless communication device 400, may be used to implement any one or more of the processes described below and illustrated in FIGS. 5-10.

In this example, the processing system 414 may be implemented with a bus architecture, represented generally by the bus 402. The bus 402 may include any number of interconnecting buses and bridges depending on the specific application of the processing system 414 and the overall design constraints. The bus 402 links together various circuits including one or more processors (represented generally by the processor 404), a memory 405, and computer-readable media (represented generally by the computer-readable medium 406). The bus 402 may also link various other circuits such as timing sources, peripherals, voltage regulators, and power management circuits, which are well known in the art, and therefore, will not be described any further. A bus interface 408 provides an interface between the bus 402 and a transceiver 410. The transceiver 410 provides a means for communicating with various other apparatus over a transmission medium. Depending upon the nature of the apparatus, a user interface 412 (e.g., keypad, display, speaker, microphone, joystick) may also be provided.

The processor 404 is responsible for managing the bus 402 and general processing, including the execution of software stored on the computer-readable medium 406. The software, when executed by the processor 404, causes the processing system 414 to perform the various functions described below for any particular apparatus. The computer-readable medium 406 may also be used for storing data that is manipulated by the processor 404 when executing software.

One or more processors 404 in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise. The software may reside on a computer-readable medium 406. The computer-readable medium 406 may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium 406 may reside in the processing system 414, external to the processing system 414, or distributed across multiple entities including the processing system 414. The computer-readable medium 406 may be embodied in a computer program product. By way of example, a computer program product may include a computer-readable medium in packaging materials. Those skilled in the art will recognize how best to implement the described functionality presented throughout this disclosure depending on the particular application and the overall design constraints imposed on the overall system.

In some aspects of the disclosure, the processor 404 may include circuitry configured for various functions. For example, the processor 404 may include a polar encoder 441, which may in some examples operate in coordination with polar encoding software 451 stored in the computer-readable storage medium 406. The polar encoder 441 may be configured to polar code an information block to produce a polar codeword having a codeword length of N.

In various aspects of the present disclosure, the polar encoder 441 may be configured to utilize a master sequence 460 of length $N_{max}$ stored in memory 405 to select the K bit locations with the highest reliability as information bits and the remaining bit locations (N–K) as frozen bits. For example, from the master sequence 460 of length $N_{max}$, a bit location sequence S with codeword length N (where $N<N_{max}$) may be obtained by selecting the bit locations (indexes) in the master sequence corresponding to each bit location in S in the order listed in the master sequence. As an example, for a codeword length N of 8, bit locations 0 . . . 7 may be selected from the master sequence in the order listed in the master sequence.

The polar encoder 441 may further be configured to puncture the polar codeword to produce a punctured codeword. Puncturing may be utilized to obtain codewords of arbitrary length (e.g., lengths that are not necessarily a power of 2). In some examples, puncturing may be performed using a puncturing pattern that identifies which coded bits to puncture. The puncturing pattern may be represented as a puncturing vector $P=(P_1, P_2, \ldots, P_N)$ including pattern bits P at locations 1–N. The value of each pattern bit location of the puncturing vector P determines whether a coded bit at a corresponding coded bit location in the coded bit vector c is punctured or kept. For example, if the value at a pattern bit location in the puncturing pattern is zero, the coded bit at the corresponding coded bit location in the polar codeword may be punctured (removed), whereas if the value is 1, the coded bit at that coded bit location may be kept.

In various aspects of the disclosure, a uniform or quasi-uniform puncturing pattern may be utilized. However, those skilled in the art will recognize that non-uniform (e.g., random) puncturing may be utilized within the scope of the present disclosure. In some examples, the polar encoder 441 may generate the uniform or quasi-uniform puncturing pattern from an initial puncturing pattern including one or more initial punctured bit locations. An example of an initial puncturing pattern is one in which all of the elements have a value of 1 except for the last N−M elements, which have a value of 0. Here, N is the codeword length, and N−M is the desired block length after puncturing. As a result of the bit-reversal permutation $B_N$ applied to the information block, in order to maintain correspondence between the puncturing pattern and the resulting polar codeword, bit-reversal permutation may also be performed on the initial puncturing pattern to produce a final puncturing pattern that is similar to a uniform puncturing pattern. The punctured bit locations may be different in the final puncturing pattern than in the initial puncturing pattern based on the bit-reversal permutation applied. The final puncturing pattern functions as a mask, puncturing N−M coded bits of the polar codeword to which it is applied.

When puncturing is utilized, the polar encoder 441 may utilize the bit location sequence S obtained from the master sequence to determine which bit locations to puncture, which bit locations to set as information bits and which bit locations to set as frozen bits. In an example, after bit reversal permutation of the puncture pattern, the polar encoder 441 may set the bit locations corresponding to the punctured bit locations in the puncture pattern to zero in the original information block, then determine the frozen bit locations and information bit locations in the information block from the remaining bit locations in the bit location sequence.

In an example, assume that a bit location sequence S of length 16 is as follows:

[0 1 2 4 8 3 5 6 9 10 12 7 11 13 14 15].

Then, assume the puncture pattern before bit reversal permutation is:

[1 1 1 1 1 1 1 1 1 1 1 1 1 1 0 0], and after bit-reversal permutation is:

[1 1 1 1 1 1 1 0 1 1 1 1 1 1 1 0].

Using the bit reversal puncture pattern, the bit locations in the bit location sequence S corresponding to the bit locations of zero's in the bit reversal puncture pattern may be set as frozen bits. For example, using the above example, bit locations seven and fifteen in the bit location sequence may be set as frozen bits. Then, assuming a code rate of ½, six additional bits may then be set as frozen bits in the bit sequence S. Here, with N=16 and R=½, the number of information bits K may be determined as N*R (e.g., 16*½=8) and the number of frozen bits may be determined as N−K (e.g., 16−8=8). With two bit locations already set to zero based on the puncture pattern, only six additional bit locations should be set as frozen bits. In the above sequence S, bit locations 0, 1, 2, 4, 8, and 3 may be set as frozen bits. Thus, N−M bit locations in the original information block may be set as frozen bits corresponding to the puncture pattern and then an additional M-K bit locations in the original information block may be set as frozen bits. Information bits may then be placed in the remaining K bit locations in the original information block. Using the above example, information bits may be placed in bit locations 5, 6, 9, 10, 12, 11, 13, and 14.

The resulting information block may be polar coded to produce a polar codeword of length N, which may then be punctured using the puncture pattern to produce a codeword of length M. The codeword may then be further processed and transmitted to a receiving wireless communication device via the transceiver 410.

The processor 404 may further include nested sequence generation circuitry 442, which may in some examples operate in co-ordination with nested sequence generation software 452 stored in the computer-readable medium 406. The nested sequence generation circuitry 442 may be configured to generate the single master sequence 460 and store the single master sequence 460 in memory 405. In some examples, the nested sequence generation circuitry 442 may be configured to select the maximum codeword length $N_{max}$ and the rate level m for construction of the master sequence 460. The nested sequence generation circuitry 442 may then construct the master sequence 460, as described above in connection with FIG. 2.

Further, the processor 404 may include a polar decoder 443, which may in some examples operate in coordination with polar decoding software 453 stored in the computer-readable medium 406. The polar decoder 443 may be configured to receive a punctured polar codeword and decode the punctured polar codeword to produce the original information block. In some examples, the polar decoder 443 may perform successive cancellation (SC) polar decoding or SC polar list decoding to decode the punctured polar codeword.

In various aspects of the disclosure, the polar decoder 443 may further utilize the master sequence 460 maintained in memory 405 to ascertain the bit locations of frozen bits and information bits. In some examples, the master sequence 460 may be pre-stored on the wireless communication device 400. In other examples, the master sequence may be calculated by the nested sequence generation circuitry 442. In still other examples, the master sequence may be received from a transmitting wireless communication device.

Figure 5:
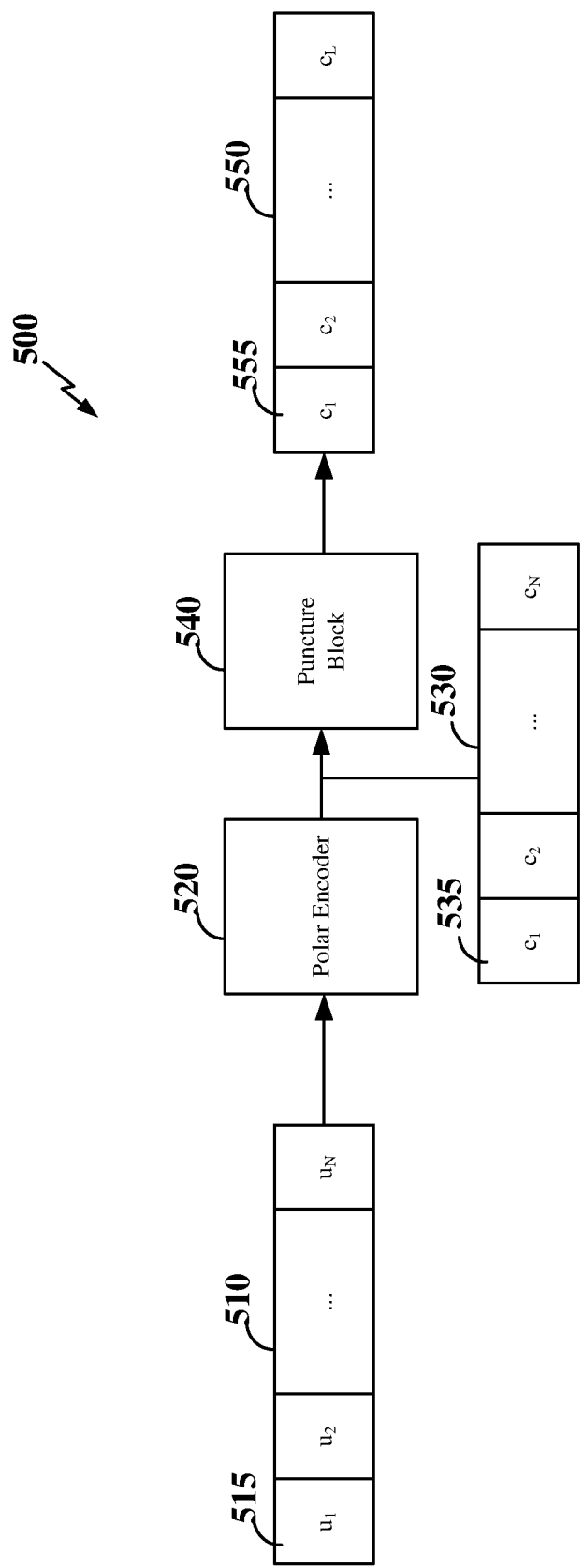
FIG. 5 is a diagram illustrating an example of polar coding and puncturing according to some aspects of the disclosure.

FIG. 5 is a diagram illustrating an example operation 500 of polar coding and puncturing according to some embodiments. In FIG. 5, an information block 510 is provided including N original bit locations 515, each containing an original bit ($u_1, u_2, \ldots, u_N$). Each of the original bits corresponds to an information bit or a frozen bit. The information block 510 is received by a polar encoder 520. The polar encoder 520 polar encodes the information block to produce a polar codeword 530 including N coded bit locations 435, each containing a coded bit ($c_1, c_2, \ldots, c_N$).

The polar codeword 530 is received by a puncture block 540. The puncture block 540 applies a puncturing pattern to the polar codeword to puncture (N−M) coded bits from the polar codeword to produce a polar codeword having a codeword length of L, where L=(N−M). Thus, at the output of the puncture block 540 is a punctured codeword 550 including L coded bit locations 555, each including one of the non-punctured coded bits ($c_1, c_2, \ldots, c_L$). It should be noted that the polar encoder 520 and puncture block 540 may, in some examples, correspond to the polar encoder 441 and polar encoding software 451 shown and described above in connection with FIG. 4 or the polar encoder 320 shown and described above in connection with FIG. 3.

Figure 6:
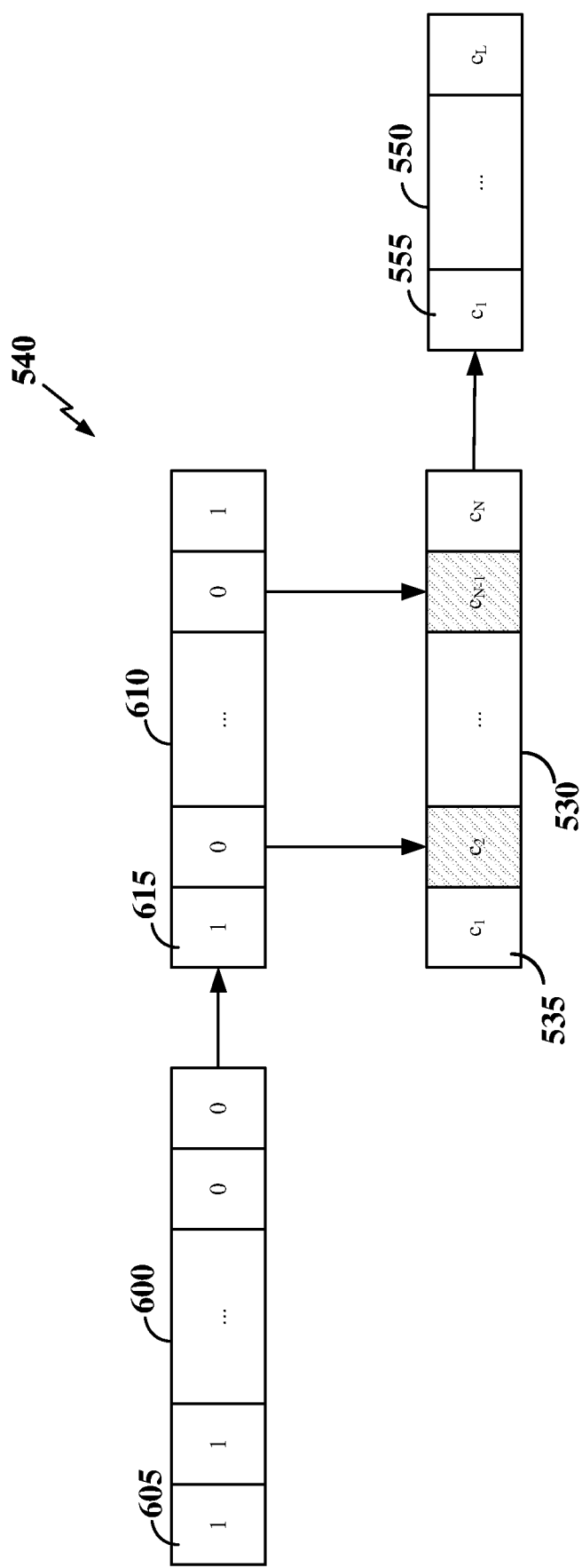
FIG. 6 is a diagram illustrating an example of puncturing according to some aspects of the disclosure.

An example operation of the puncture block 540 is shown in FIG. 6. In FIG. 6, an initial puncturing pattern 600 is generated including a plurality of pattern bit locations 605. Each of the pattern bit locations 605 corresponds to one of the coded bit locations 535 of the polar codeword 530 generated by the polar encoder 520 shown in FIG. 5. The value of each pattern bit location 605 determines whether a coded bit at a corresponding coded bit location 535 in the polar codeword 530 is punctured or kept. For example, if the value at a pattern bit location in the puncturing pattern is zero, the coded bit at the corresponding coded bit location in the polar codeword may be punctured (removed), whereas if the value is one, the coded bit at that coded bit location may be kept. In the example shown in FIG. 6, the value of the last N−M pattern bit locations 605 is set to zero.

As a result of the bit-reversal permutation applied to the information block when generating the polar codeword 530, in order to maintain correspondence between the puncturing pattern 600 and the resulting polar codeword 530, bit-reversal permutation may also be performed on the initial puncturing pattern 600 to produce a final puncturing pattern 610 that is similar to a uniform puncturing pattern. The final puncturing pattern 610 includes the same number of pattern bit locations 615 as the initial puncture pattern 600, but as shown in FIG. 6, the punctured bit locations may be different in the final puncturing pattern 610 than in the initial puncturing pattern 600 based on the bit-reversal permutation applied. The final puncturing pattern 610 may then be applied to the polar codeword 530 and function as a mask, puncturing N−M coded bits of the polar codeword 530 to produce the punctured polar codeword 550 having a codeword length of L. In the example shown in FIG. 6, coded bits $c_2$ and $c_{N-1}$ are illustrated as being punctured, for simplicity.

Figure 7:
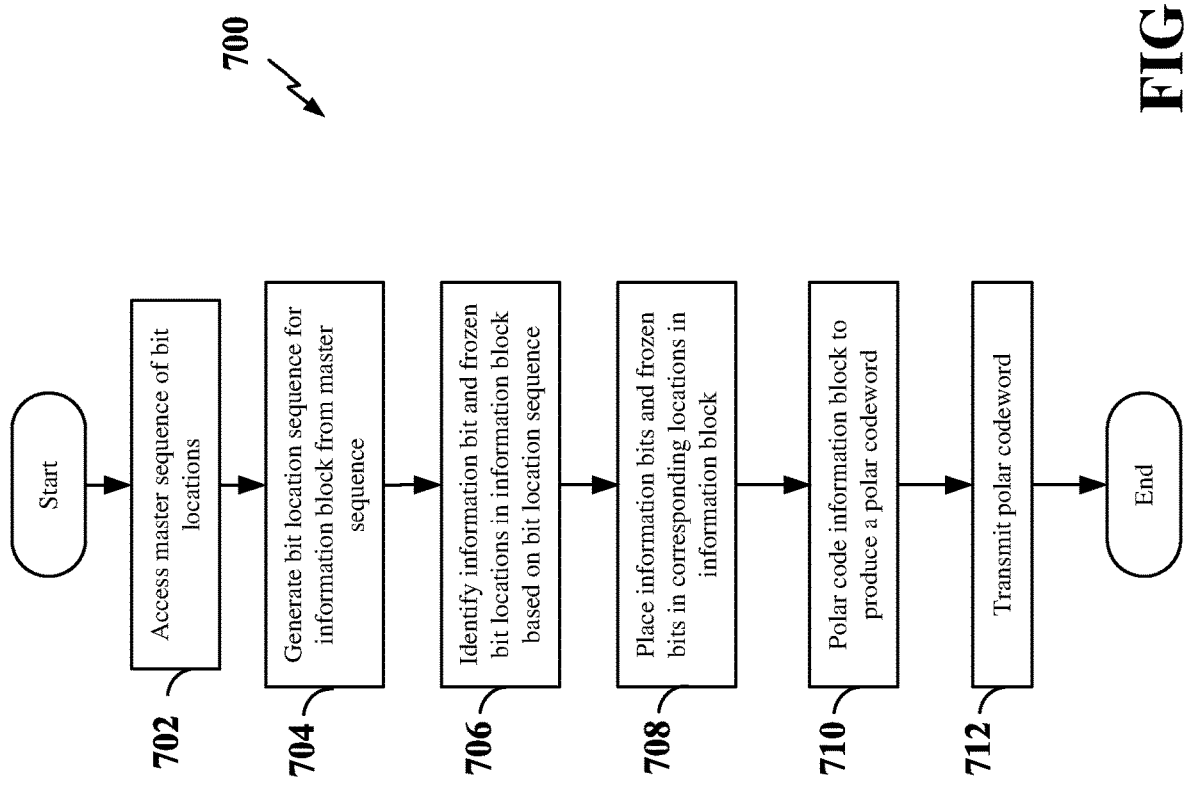
FIG. 7 is a flow chart illustrating an exemplary process for polar coding according to some aspects of the disclosure.

FIG. 7 is a flow chart illustrating an exemplary process 700 for polar coding according to some aspects of the present disclosure. In some examples, the process 700 may be implemented by a wireless communication device as described above and illustrated in FIGS. 1-6. In some examples, the process 700 may be implemented by any suitable means for carrying out the described functions.

At block 702, the wireless communication device may access a master sequence of bit locations maintained in order of reliability. In some examples, the master sequence may be generated off-line and stored in memory in the wireless communication device. In some examples, the master sequence may be generated utilizing density evolution and may be nested over a code rate vector including a plurality of code rates having the same rate level (e.g., code rate denominator). In addition, the master sequence may have a suitable maximum length $N_{max}$. For example, the polar encoder 441 and/or the nested sequence generation circuitry 442 shown and described above in connection with FIG. 4 may access the master sequence.

At block 704, the wireless communication device may generate a bit location sequence from the master sequence for an information block. In some examples, the information block has a block length less than the maximum block length of the master sequence. The bit location sequence for the information block includes a number of bit locations corresponding to the block length that are arranged in order of reliability according to the master sequence. For example, the polar encoder 441 shown and described above in connection with FIG. 4 may generate the bit location sequence for the information block.

At block 706, the wireless communication device may identify information bit locations and frozen bit locations in the information block based on the bit location sequence. In some examples, the information bit locations correspond to the bit locations in the bit location sequence having a highest reliability and the frozen bit locations correspond to the bit locations in the bit location sequence having the lowest reliability. The number of information bits and frozen bits may be determined, for example, based on the code rate selected for the information block. For example, the polar encoder 441 shown and described above in connection with FIG. 4 may identify the information bit locations and frozen bit locations from the bit location sequence.

At block 708, the wireless communication device may place information bits in the information bit locations of the information block and frozen bits in the frozen bit locations of the information block. For example, the polar encoder 441 shown and described above in connection with FIG. 4 may place the information bits and frozen bits in the corresponding information bit and frozen bit locations of the information block.

At block 710, the wireless communication device may polar code the information block to produce a polar codeword, and at block 712, transmit the polar codeword to a receiving wireless communication device over a wireless air interface. For example, the polar encoder 441 shown and described above in connection with FIG. 4 may polar code the information block, which may then be transmitted via transceiver 410.

Figure 8:
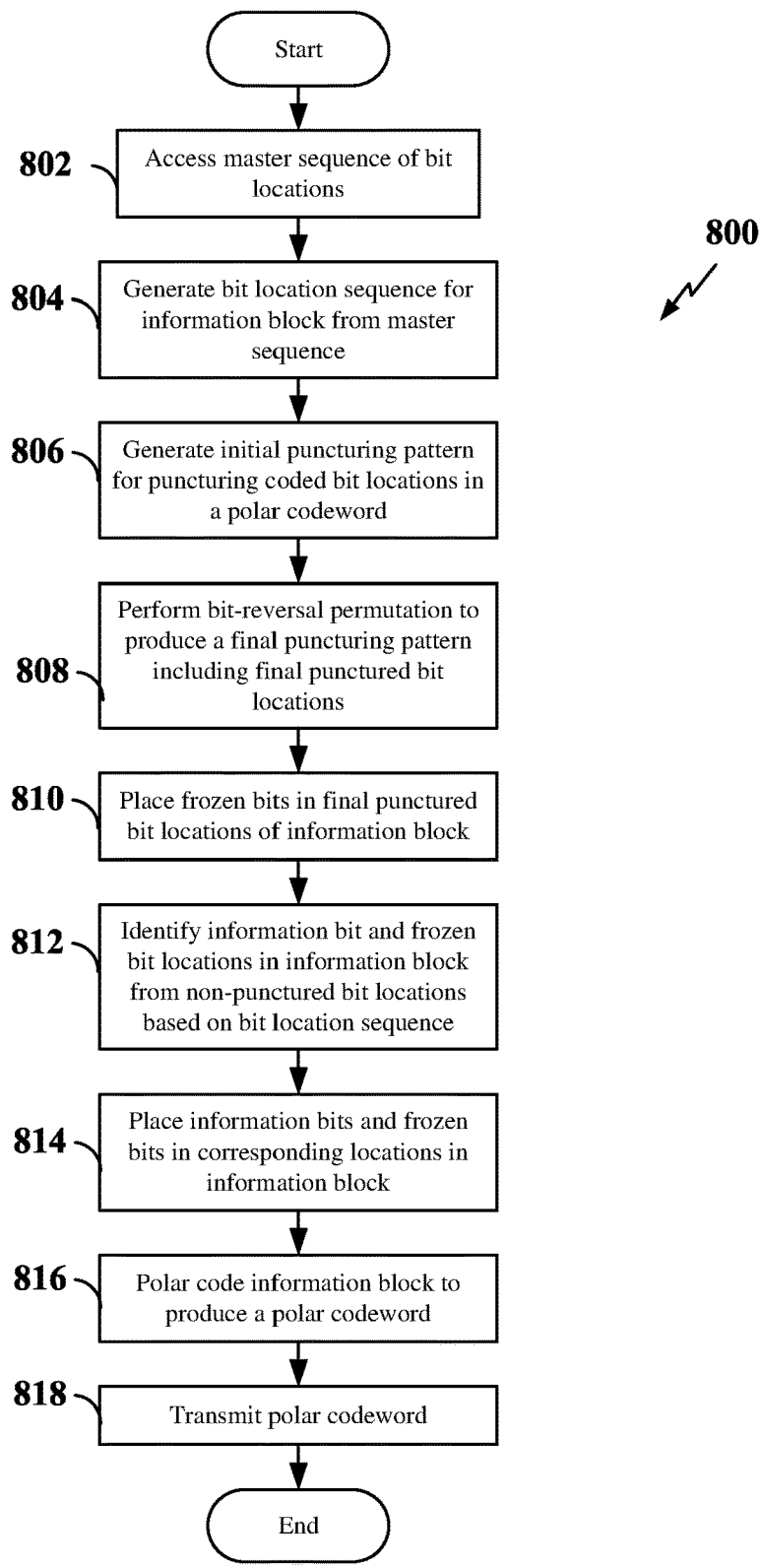
FIG. 8 is a flow chart illustrating another exemplary process for polar coding according to some aspects of the disclosure.

FIG. 8 is a flow chart illustrating an exemplary process 800 for polar coding according to some aspects of the present disclosure. In some examples, the process 800 may be implemented by a wireless communication device as described above and illustrated in FIGS. 1-6. In some examples, the process 800 may be implemented by any suitable means for carrying out the described functions.

At block 802, the wireless communication device may access a master sequence of bit locations maintained in order of reliability. In some examples, the master sequence may be generated off-line and stored in memory in the wireless communication device. In some examples, the master sequence may be generated utilizing density evolution and may be nested over a code rate vector including a plurality of code rates having the same rate level (e.g., code rate denominator). In addition, the master sequence may have a suitable maximum length $N_{max}$. For example, the polar encoder 441 and/or the nested sequence generation circuitry 442 shown and described above in connection with FIG. 4 may access the master sequence.

At block 804, the wireless communication device may generate a bit location sequence from the master sequence for an information block. In some examples, the information block has a block length less than the maximum block length of the master sequence. The bit location sequence for the information block includes a number of bit locations corresponding to the block length that are arranged in order of reliability according to the master sequence. For example, the polar encoder 441 shown and described above in connection with FIG. 4 may generate the bit location sequence for the information block.

At block 806, the wireless communication device may generate an initial puncturing pattern including initial punctured bit locations for puncturing corresponding coded bit locations in a polar codeword produced by polar coding the information block. For example, the polar encoder 441 shown and described above in connection with FIG. 4 may generate the initial puncturing pattern.

At block 808, the wireless communication device may perform bit-reversal permutation on the initial puncturing pattern to produce a final puncturing pattern including final punctured bit locations. The final puncturing pattern includes the same number of bit locations as the initial puncture pattern, but the punctured bit locations may be different in the final puncturing pattern than in the initial puncturing pattern based on the bit-reversal permutation applied. For example, the polar encoder 441 shown and described above in connection with FIG. 4 may perform bit-reversal permutation on the initial puncturing pattern.

At block 810, the wireless communication device may place frozen bits in the bit locations of the information block corresponding to the final punctured bits locations in the final puncturing pattern. For example, the polar encoder 441 shown and described above in connection with FIG. 4 may place frozen bits in the final punctured bit locations of the information block.

At block 812, the wireless communication device may identify information bit locations and frozen bit locations in the information block from the non-punctured bit locations in the information block based on the bit location sequence. In some examples, the information bit locations correspond to the non-punctured bit locations in the bit location sequence having a highest reliability and the frozen bit locations correspond to the non-punctured bit locations in the bit location sequence having the lowest reliability. The number of information bits and frozen bits may be determined, for example, based on the code rate selected for the information block. For example, the polar encoder 441 shown and described above in connection with FIG. 4 may identify the information bit locations and frozen bit locations from the bit location sequence.

At block 814, the wireless communication device may place information bits in the information bit locations of the information block and frozen bits in the frozen bit locations of the information block. For example, the polar encoder 441 shown and described above in connection with FIG. 4 may place the information bits and frozen bits in the corresponding information bit and frozen bit locations of the information block.

At block 816, the wireless communication device may polar code the information block to produce a polar codeword, and at block 818, transmit the polar codeword to a receiving wireless communication device over a wireless air interface. For example, the polar encoder 441 shown and described above in connection with FIG. 4 may polar code the information block, which may then be transmitted via transceiver 410.

Figure 9:
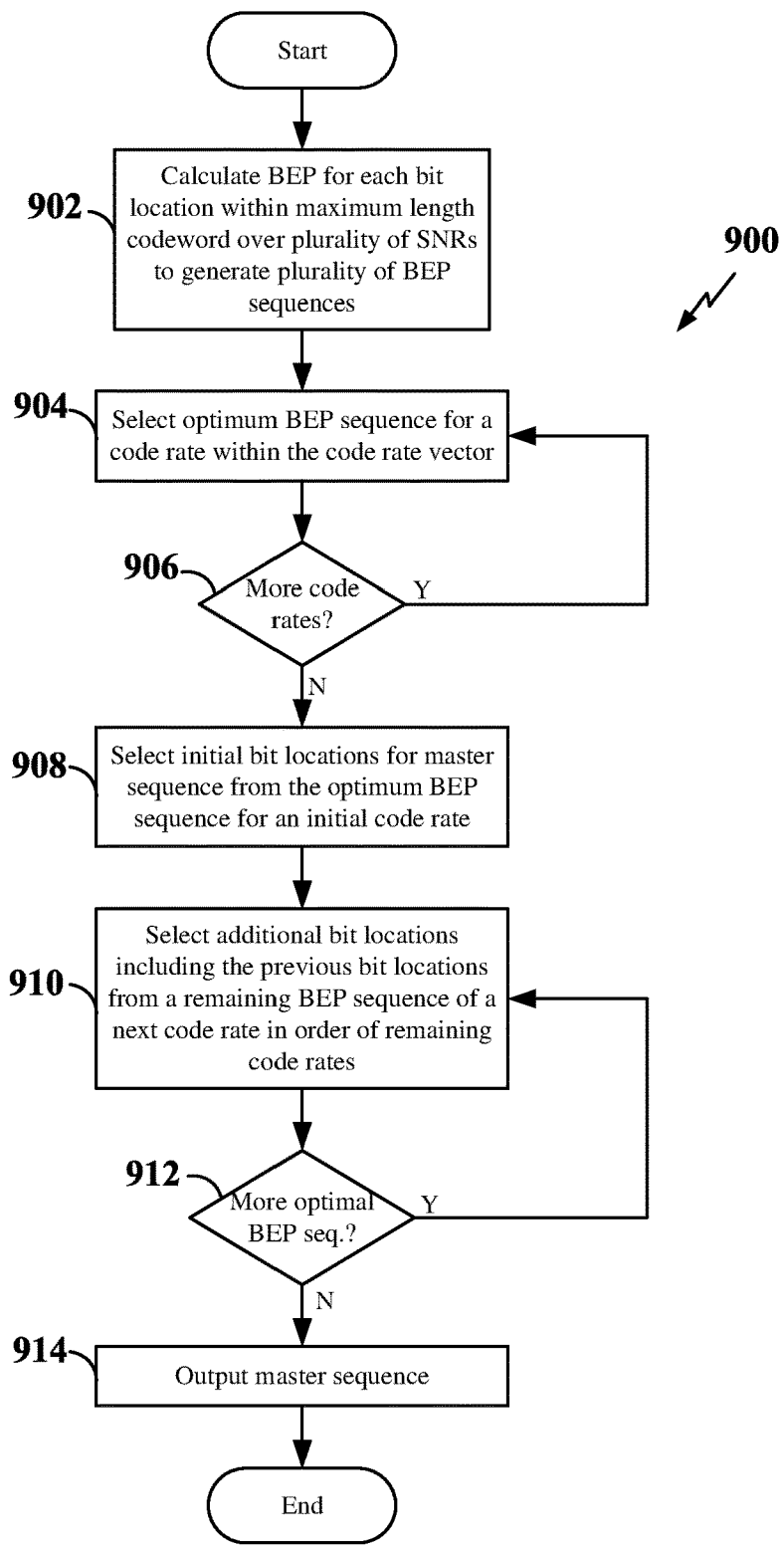
FIG. 9 is a flow chart illustrating an exemplary process for generating a master sequence for polar coding according to some aspects of the disclosure.

FIG. 9 is a flow chart illustrating an exemplary process 900 for generating a master sequence for polar coding according to some aspects of the present disclosure. In some examples, the process 900 may be implemented by a wireless communication device as described above and illustrated in FIGS. 1-6 or other suitable apparatus. In some examples, the process 900 may be implemented by any suitable means for carrying out the described functions. The process 900 shown in FIG. 9 may be performed off-line and the generated master sequence may be stored in memory in the wireless communication device.

At block 902, the apparatus may utilize density evolution to calculate a bit error probability (BEP) for each bit location within a maximum length codeword (e.g., a codeword having a suitable maximum length $N_{max}$) over a plurality of signal-to-noise ratios (SNRs) to generate a plurality of BEP sequences. In some examples, each of the BEP sequences corresponds to one of the SNRs within a range of SNRs and includes a respective BEP for each bit location within the maximum length codeword. The range of SNRs may include a maximum and minimum SNR with a step size between each SNR within the range. For example, an SNR range of −20 dB to 20 dB with a step size of 0.5 dB may be utilized. It should be understood that any suitable range of SNRs and suitable step size within the range of SNRs may be chosen. For example, the nested sequence generation circuitry 442 shown and described above in connection with FIG. 4 may generate the BEP sequences.

At block 904, the apparatus may select an optimum BEP sequence of the plurality of BEP sequences for a code rate within a code rate vector. For example, based on $N_{max}$, a suitable code rate vector R, each with same rate level m (e.g., code rate denominator) may be chosen such that $1 < m < N_{max}$. The optimal BEP sequence for a particular code rate $R_i$ within the code rate vector R may then be chosen by selecting the $K_i$ best (most reliable or smallest BEP value) bit locations within each BEP sequence, where $K_i = N_{max} R_i$ and comparing the $K_i$ best bit locations within each BEP sequence to identify the optimal BEP sequence. At block 906, the apparatus determine whether there are more code rates within the code rate vector. If there are more code rates (Y branch of block 906), the process returns to block 904, where the apparatus may select the optimum BEP sequence of the plurality of BEP sequences for the next code rate. Thus, for each code rate $R_i$ within the code rate vector R, a respective optimal BEP sequence within the plurality of BEP sequences may be obtained. For example, the nested sequence generation circuitry 442 shown and described above in connection with FIG. 4 may select the optimum BEP sequences.

Once a respective optimal BEP sequence is selected for each code rate within the code rate vector (N branch of block 906), at block 908, the apparatus may select initial bit locations for the master sequence from the optimum BEP sequence for an initial code rate in the code rate vector. In some examples, again using the code rate vector R with a rate level of m, the initial code rate may be the first (lowest) code rate $R_1$ in the code rate vector R. In this example, the $K_1$ bit locations having the lowest BEP (highest reliability) in the optimum BEP sequence for the first (lowest) code rate $R_1$ in the code rate vector R may be selected as the initial bit locations in the master sequence. In other examples, again using the code rate vector R with a rate level of m, the initial code rate may be the last (highest) code rate $R_{m-1}$ in the code rate vector R. In this example, the $N_{max}(1-R_{m-1})$ or $(N_{max} - K_{m-1})$ bit locations having the highest BEP (lowest reliability) in the optimum BEP sequence for the first code rate $R_{m-1}$ in the code rate vector R may be selected as the initial bit locations in the master sequence. For example, the nested sequence generation circuitry 442 shown and described above in connection with FIG. 4 may select the initial bit locations for the master sequence.

At block 910, the apparatus may select additional bit locations including the previously selected bit locations from a remaining BEP sequence of a next code rate in the code rate vector in order of remaining code rates. In some examples, when the initial code rate was the first (lowest) code rate $R_1$ in the code rate vector R, the bit locations corresponding to the ones selected for $R_1$ are retained (excluded from consideration), and the $K_2 - K_1$ bit locations with the lowest BEP (highest reliability) in the optimum BEP sequence for the second (next lowest) code rate $R_2$ in the code rate vector R may be selected as the additional bit locations in the master sequence. In some examples, when the initial code rate was the last (highest) code rate $R_{m-1}$ in the code rate vector R, the bit locations corresponding to the ones selected for $R_{m-1}$ are retained (excluded from consideration), and the $N_{max}(R_{m-2} - R_{m-1})$ bit locations having the highest BEP (lowest reliability) in the optimum BEP sequence for the second (next highest) code rate $R_{m-2}$ in the code rate vector R may be selected as the additional bit locations in the master sequence. For example, the nested sequence generation circuitry 442 shown and described above in connection with FIG. 4 may select the additional bit locations for the master sequence.

At block 912, the apparatus may determine whether there are more optimal BEP sequences (e.g., more code rates in the code rate vector having optimal BEP sequences that have not yet been utilized to select additional bits for the master sequence). If there are more optimal BEP sequences (Y branch of block 912), the process returns to block 910, where the apparatus may select additional bit locations including the previously selected bit locations from a remaining BEP sequence of a next code rate in the code rate vector. Once all of the bit locations for the master sequence have been selected (N branch of block 912), at block 914, the apparatus may output the generated master sequence. For example, the nested sequence generation circuitry 442 shown and described above in connection with FIG. 4 may output the master sequence.

Figure 10:
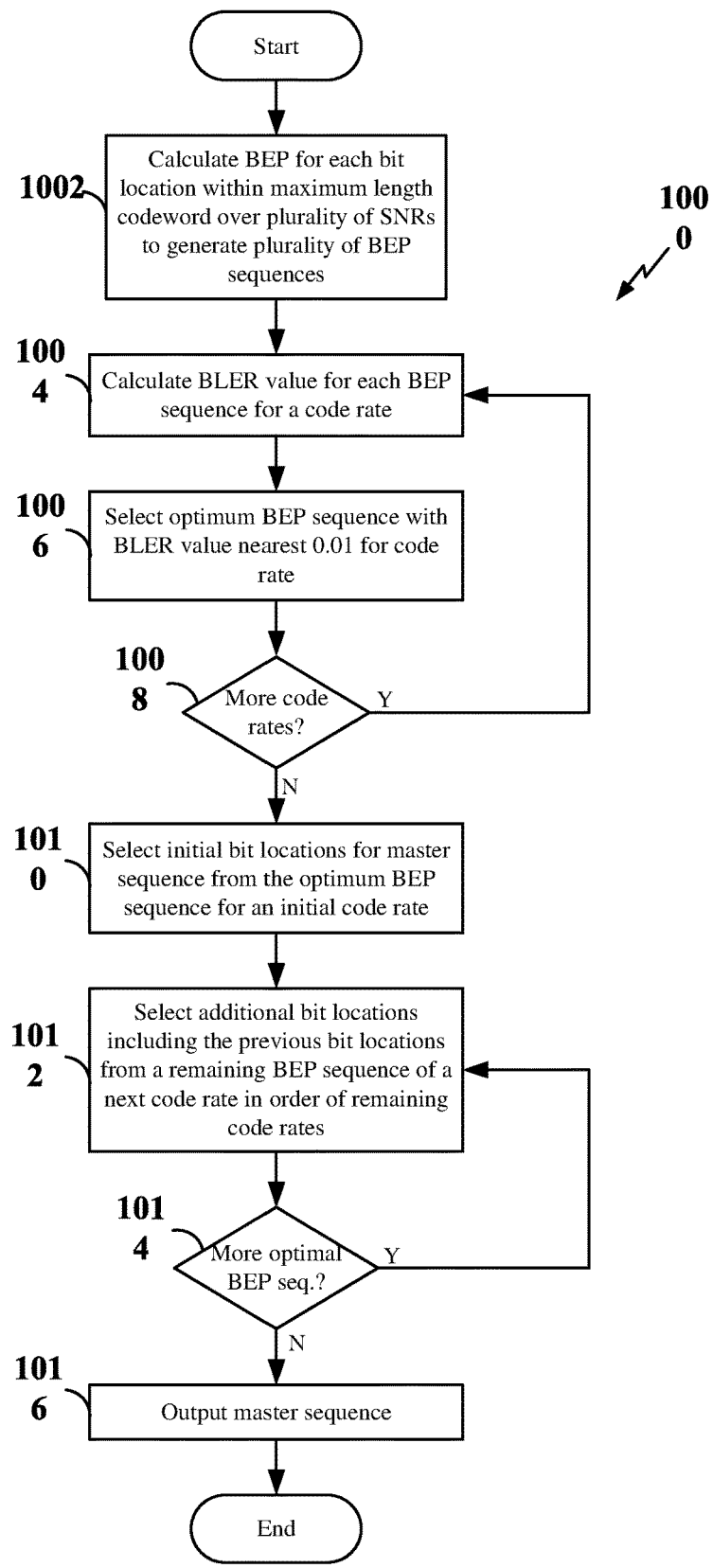
FIG. 10 is a flow chart illustrating another exemplary process for generating a master sequence for polar coding according to some aspects of the disclosure.

FIG. 10 is a flow chart illustrating an exemplary process 1000 for generating a master sequence for polar coding according to some aspects of the present disclosure. In some examples, the process 1000 may be implemented by a wireless communication device as described above and illustrated in FIGS. 1-6 or other suitable apparatus. In some examples, the process 1000 may be implemented by any suitable means for carrying out the described functions. The process 1000 shown in FIG. 10 may be performed off-line and the generated master sequence may be stored in memory in the wireless communication device.

At block 1002, the apparatus may utilize density evolution to calculate a bit error probability (BEP) for each bit location within a maximum length codeword (e.g., a codeword having a suitable maximum length $N_{max}$) over a plurality of signal-to-noise ratios (SNRs) to generate a plurality of BEP sequences. In some examples, each of the BEP sequences corresponds to one of the SNRs within a range of SNRs and includes a respective BEP for each bit location within the maximum length codeword. The range of SNRs may include a maximum and minimum SNR with a step size between each SNR within the range. For example, an SNR range of −20 dB to 20 dB with a step size of 0.5 dB may be utilized. It should be understood that any suitable range of SNRs and suitable step size within the range of SNRs may be chosen. For example, the nested sequence generation circuitry 442 shown and described above in connection with FIG. 4 may generate the BEP sequences.

At block 1004, the apparatus may calculate a block error rate (BLER) value for each BEP sequence for a code rate within a code rate vector. For example, again assuming a code rate vector R, for a particular code rate $R_i$ within the code rate vector R, the $K_i$ best (most reliable or smallest BEP value) bit locations within each BEP sequence may be selected, where $K_i=N_{max}R_i$, and the block error rate (BLER) of each BEP sequence may be calculated based on the BEPs of the $K_i$ best bit locations in that BEP sequence (e.g., as the linear sum of the BEPs of the $K_i$ best bit locations). At block 1006, the apparatus may select the optimum BEP sequence for the particular code rate as the BEP sequence having a BLER value nearest 0.01.

At block 1008, the apparatus may determine whether there are more code rates within the code rate vector. If there are more code rates (Y branch of block 1008), the process returns to blocks 1004 and 1006, where the apparatus may calculate the BLER value for each BEP sequence for the next code rate in the code rate vector and select the optimum BEP sequence for the next code rate. Thus, for each code rate $R_i$ within the code rate vector R, a respective optimal BEP sequence within the plurality of BEP sequences may be obtained. Since the number of bit locations utilized to calculate the BLER will vary between code rates, the BLER values of each BEP sequence will be different between code rates, and therefore, the optimum BEP sequence for each code rate will vary. For example, the nested sequence generation circuitry 442 shown and described above in connection with FIG. 4 may calculate the BLER value for each BEP sequence for a particular code rate within the code rate vector and select the optimum BEP sequence for that code rate having a BLER value nearest 0.01.

Once a respective optimal BEP sequence is selected for each code rate within the code rate vector (N branch of block 1008), at block 1010, the apparatus may select initial bit locations for the master sequence from the optimum BEP sequence for an initial code rate in the code rate vector. In some examples, again using the code rate vector R with a rate level of m, the initial code rate may be the first (lowest) code rate $R_1$ in the code rate vector R. In this example, the $K_1$ bit locations having the lowest BEP (highest reliability) in the optimum BEP sequence for the first (lowest) code rate $R_1$ in the code rate vector R may be selected as the initial bit locations in the master sequence. In other examples, again using the code rate vector R with a rate level of m, the initial code rate may be the last (highest) code rate $R_{m-1}$ in the code rate vector R. In this example, the $N_{max}(1-R_{m-1})$ or $(N_{max}-K_{m-1})$ bit locations having the highest BEP (lowest reliability) in the optimum BEP sequence for the first code rate $R_{m-1}$ in the code rate vector R may be selected as the initial bit locations in the master sequence. For example, the nested sequence generation circuitry 442 shown and described above in connection with FIG. 4 may select the initial bit locations for the master sequence.

At block 1012, the apparatus may select additional bit locations including the previously selected bit locations from a remaining BEP sequence of a next code rate in the code rate vector in order of remaining code rates. In some examples, when the initial code rate was the first (lowest) code rate $R_1$ in the code rate vector R, the bit locations corresponding to the ones selected for $R_1$ are retained (excluded from consideration), and the $K_2-K_1$ bit locations with the lowest BEP (highest reliability) in the optimum BEP sequence for the second (next lowest) code rate $R_2$ in the code rate vector R may be selected as the additional bit locations in the master sequence. In some examples, when the initial code rate was the last (highest) code rate $R_{m-1}$ in the code rate vector R, the bit locations corresponding to the ones selected for $R_{m-1}$ are retained (excluded from consideration), and the $N_{max}(R_{m-2}-R_{m-1})$ bit locations having the highest BEP (lowest reliability) in the optimum BEP sequence for the second (next highest) code rate $R_{m-2}$ in the code rate vector R may be selected as the additional bit locations in the master sequence. For example, the nested sequence generation circuitry 442 shown and described above in connection with FIG. 4 may select the additional bit locations for the master sequence.

At block 1014, the apparatus may determine whether there are more optimal BEP sequences (e.g., more code rates in the code rate vector having optimal BEP sequences that have not yet been utilized to select additional bits for the master sequence). If there are more optimal BEP sequences (Y branch of block 1014), the process returns to block 1012, where the apparatus may select additional bit locations including the previously selected bit locations from a remaining BEP sequence of a next code rate in the code rate vector. Once all of the bit locations for the master sequence have been selected (N branch of block 1014), at block 1016, the apparatus may output the generated master sequence. For example, the nested sequence generation circuitry 442 shown and described above in connection with FIG. 4 may output the master sequence.

Figure 11:
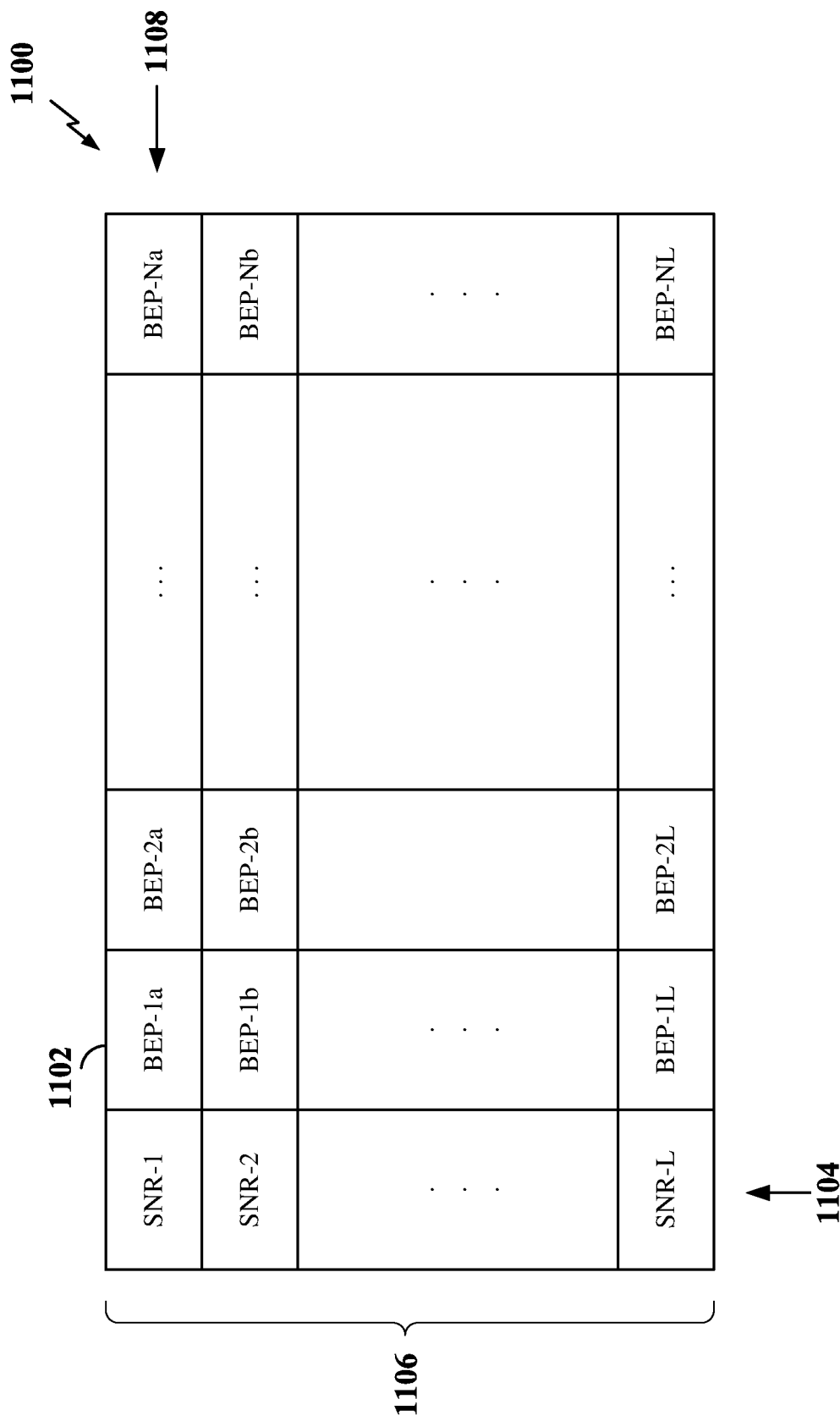
FIG. 11 is a diagram illustrating an example of a bit error probability (BEP) table according to some aspects of the disclosure.

FIG. 11 is a diagram illustrating an example of a bit error probability (BEP) table 1100 according to some aspects of the disclosure. In the example shown in FIG. 11, density evolution may be performed to calculate the bit error probability (BEP) of each bit location 1102 within a maximum length codeword for each SNR 1104 within a range of SNRs 1106 (e.g., SNR-1, SNR-2, . . . , SNR-L). The range of SNRs 1106 may include a minimum SNR (e.g., SNR-1) and a maximum SNR (e.g., SNR-L) with a step size between each SNR 1104 within the range 1106. For example, an SNR range of −20 dB to 20 dB with a step size of 0.5 dB may be utilized. It should be understood that any suitable range of SNRs and suitable step size within the range of SNRs may be chosen. At each SNR 1104 (e.g., SNR of −20 dB, SNR of −19.5 dB . . . SNR of 19.5 dB, SNR of 20 dB), the BEP may be calculated for each bit location of the maximum length codeword (e.g., bit locations 1 . . . N, where N=$N_{max}$) to produce a table of BEP sequences 1108.

As a result, the table 1100 may include a number of rows corresponding to the number of SNR values 1104 within the range of SNRs 1106 and a number of columns corresponding to the maximum codeword length $N_{max}$. Thus, each row corresponds to a particular SNR value 1104 and each column corresponds to a particular bit location 1102 (1 . . . $N_{max}$) in the codeword of length $N_{max}$. For example, as shown in FIG. 11, for a first SNR 1104 (SNR-1), a first BEP sequence 1108 may be generated that includes BEP-1a, BEP-2a, . . . , BEP-Na, for a second SNR 1104 (SNR-2), a second BEP sequence 1108 may be generated that includes BEP-1b, BEP-2b, . . . , BEP-Nb, and so on through the last SNR 1104 (SNR-L), which includes BEP-1L, BEP-2L, . . . , BEP-NL.

Using the table shown in FIG. 11, a respective block error rate (BLER) value may be calculated for each BEP sequence 1108 for a particular code rate within a code rate vector, using, for example, the K best (most reliable or smallest BEP value) bit locations 1102 within each BEP sequence 1108. An optimum BEP sequence (e.g., one of the BEP sequences 1108) for the particular code rate may then be selected as the BEP sequence having a BLER value nearest 0.01. From the optimum BEP sequences 1108 (e.g., one for each code rate), the master sequence may be constructed, as described above in connection with FIGS. 9 and 10.

An example of a master sequence generated for a maximum codeword length $N_{max}$ of 2048 and constructed in ascending order of reliability is provided below:

0, 1, 2, 4, 8, 16, 3, 32, 5, 6, 9, 64, 10, 17, 12, 128, 18, 33, 20, 7, 34, 256, 24, 65, 36, 11, 512, 66, 40, 13, 68, 129, 19, 1024, 14, 48, 130, 72, 21, 132, 257, 35, 80, 22, 25, 258, 136, 37, 96, 26, 260, 513, 144, 38, 67, 28, 41, 514, 264, 160, 69, 42, 516, 1025, 15, 49, 70, 44, 131, 73, 23, 50, 74, 272, 133, 52, 81, 27, 192, 76, 134, 520, 1026, 39, 288, 56, 82, 137, 259, 29, 1028, 528, 97, 138, 320, 84, 30, 261, 43, 145, 98, 1032, 544, 140, 88, 384, 262, 71, 146, 100, 45, 265, 1040, 576, 515, 161, 51, 148, 46, 104, 266, 1056, 640, 162, 517, 75, 273, 152, 53, 77, 54, 135, 268, 112, 193, 83, 57, 164, 274, 518, 78, 521, 194, 289, 1027, 58, 1088, 168, 31, 276, 139, 85, 768, 522, 290, 196, 60, 529, 280, 176, 1152, 99, 1029, 86, 524, 321, 141, 292, 200, 89, 530, 263, 1030, 1280, 147, 322, 142, 101, 1033, 296, 545, 90, 208, 47, 532, 385, 1536, 324, 102, 1034, 546, 149, 267, 92, 105, 55, 163, 150, 304, 106, 153, 536, 224, 269, 1041, 79, 386, 577, 328, 113, 1036, 548, 165, 275, 154, 108, 519, 59, 270, 1042, 388, 578, 114, 336, 166, 552, 195, 1057, 156, 1044, 277, 169, 641, 392, 580, 116, 61, 352, 87, 560, 1058, 523, 291, 278, 1048, 170, 197, 642, 400, 584, 62, 120, 1089, 281, 1060, 177, 143, 91, 198, 525, 172, 293, 103, 282, 201, 178, 531, 93, 526, 294, 1031, 769, 644, 323, 202, 284, 151, 592, 1090, 416, 180, 297, 94, 1064, 533, 209, 107, 770, 648, 1153, 204, 1092, 608, 298, 448, 184, 325, 1072, 547, 1035, 534, 210, 772, 305, 656, 1154, 155, 1096, 109, 537, 300, 326, 271, 225, 387, 212, 776, 329, 1281, 306, 167, 115, 110, 157, 549, 63, 1037, 538, 117, 158, 226, 279, 1043, 171, 330, 550, 216, 308, 389, 579, 1038, 540, 1156, 118, 672, 337, 553, 1104, 228, 332, 121, 199, 390, 312, 1282, 1045, 784, 173, 1160, 338, 554, 581, 704, 393, 1120, 283, 232, 122, 179, 1059, 561, 1537, 1284, 1046, 353, 174, 800, 1168, 340, 582, 556, 394, 527, 295, 95, 203, 285, 181, 124, 1049, 643, 585, 286, 562, 240, 401, 354, 205, 299, 182, 1061, 396, 344, 1050, 535, 586, 185, 211, 111, 564, 645, 402, 356, 206, 1538, 1062, 1288, 1091, 593, 327, 1184, 832, 1052, 301, 417, 588, 1065, 186, 646, 568, 404, 360, 1540, 159, 213, 307, 1296, 594, 771, 649, 1216, 302, 896, 539, 418, 1066, 1093, 188, 119, 227, 331, 214, 551, 309, 217, 1039, 541, 609, 408, 1073, 596, 650, 368, 229, 449, 333, 1094, 310, 123, 175, 1068, 391, 773, 420, 218, 1155, 657, 542, 610, 1097, 313, 555, 1074, 339, 1544, 652, 600, 1312, 450, 230, 334, 774, 424, 220, 658, 612, 1098, 125, 233, 314, 777, 1076, 1157, 1047, 1552, 583, 452, 1344, 287, 395, 557, 673, 1105, 341, 432, 660, 183, 616, 1100, 126, 234, 316, 778, 1158, 1080, 563, 1568, 456, 674, 1408, 558, 355, 1106, 342, 1283, 1161, 241, 785, 664, 207, 624, 236, 397, 780, 1051, 345, 1121, 705, 1600, 587, 464, 676, 1108, 1162, 242, 786, 403, 565, 398, 187, 357, 1285, 1063, 346, 1122, 706, 1169, 1664, 801, 480, 680, 1112, 1164, 244, 788, 1053, 303, 589, 566, 215, 189, 647, 358, 405, 569, 348, 595, 1054, 361, 590, 190, 1067, 419, 1286, 406, 248, 570, 1170, 1124, 311, 708, 802, 362, 1289, 409, 219, 1539, 688, 651, 792, 597, 543, 1185, 1095, 572, 1172, 369, 833, 1128, 1069, 712, 804, 421, 1290, 335, 364, 231, 410, 611, 598, 1792, 1186, 1075, 1541, 1297, 221, 370, 1176, 834, 653, 315, 1070, 601, 127, 422, 222, 451, 775, 412, 659, 235, 1099, 425, 317, 613, 654, 559, 343, 602, 1077, 372, 1292, 1136, 808, 720, 1217, 1188, 426, 453, 614, 1542, 318, 1298, 661, 897, 237, 604, 1101, 1078, 836, 376, 1159, 1545, 779, 617, 816, 433, 1218, 399, 736, 1313, 1081, 1192, 243, 454, 428, 1107, 1300, 347, 675, 898, 662, 238, 1102, 567, 359, 457, 618, 665, 434, 591, 781, 245, 1082, 349, 191, 1055, 1163, 625, 1109, 407, 1546, 677, 840, 787, 458, 571, 1314, 620, 1220, 666, 436, 782, 246, 350, 1084, 1553, 1200, 1304, 363, 1123, 626, 900, 465, 1110, 249, 678, 1548, 1345, 848, 707, 460, 1165, 1316, 668, 1224, 1113, 440, 789, 1554, 681, 573, 1287, 466, 411, 628, 599, 904, 1171, 250, 1346, 365, 864, 1125, 1166, 1320, 1569, 1232, 1114, 803, 790, 682, 1556, 481, 1071, 709, 574, 223, 423, 468, 632, 1409, 371, 912, 1348, 252, 793, 366, 1126, 689, 1570, 1328, 413, 1248, 1173, 1116, 684, 482, 710, 1560, 655, 1291, 1129, 1410, 472, 603, 805, 928, 1352, 1601, 794, 713, 690, 1572, 414, 1174, 1187, 373, 319, 484, 1130, 1412, 615, 427, 1079, 605, 239, 374, 1177, 806, 835, 1293, 796, 714, 455, 663, 1103, 377, 692, 1137, 809, 429, 606, 1189, 1299, 1132, 1178, 619, 721, 1543, 488, 1602, 1294, 1360, 435, 1083, 716, 1576, 960, 378, 1138, 810, 696, 430, 837, 1190, 1219, 1180, 722, 1665, 1416, 1604, 496, 817, 1193, 1376, 351, 247, 1301, 667, 459, 1584, 621, 380, 1140, 812, 783, 1085, 437, 1111, 679, 627, 838, 622, 1547, 737, 899, 669, 461, 1086, 1315, 841, 438, 724, 1302, 1221, 1194, 818, 251, 575, 441, 1144, 1167, 1305, 467, 1201, 629, 738, 670, 1666, 1115, 462, 842, 367, 791, 1608, 1222, 1424, 728, 1196, 820, 1549, 683, 901, 1317, 442, 1306, 1225, 849, 253, 1202, 630, 740, 1127, 1793, 1555, 1668, 844, 1616, 415, 469, 1117, 711, 633, 685, 1550, 795, 254, 1175, 1318, 902, 444, 1347, 824, 483, 375, 1226, 470, 691, 1308, 1118, 850, 905, 1321, 1204, 634, 1131, 686, 807, 473, 744, 1557, 607, 1233, 1440, 865, 715, 1228, 797, 852, 1794, 906, 1322, 1349, 636, 1672, 1208, 485, 1571, 693, 1179, 431, 474, 1558, 1632, 1234, 752, 1133, 1472, 913, 1295, 379, 866, 1329, 798, 1561, 1796, 856, 908, 1350, 1324, 486, 1680, 1249, 811, 1139, 1191, 717, 694, 476, 1411, 1236, 1134, 1353, 914, 1330, 868, 489, 1573, 1181, 697, 1562, 1800, 723, 381, 1250, 1696, 718, 623, 929, 1240, 1354, 839, 916, 1332, 1574, 490, 872, 813, 1087, 1141, 1182, 1413, 439, 1603, 698, 1564, 1808, 382, 1252, 1728, 1361, 1577, 1303, 1195, 930, 497, 819, 671, 463, 725, 814, 1142, 492, 700, 1145, 1223, 1356, 631, 843, 443, 739, 1414, 726, 1336, 1197, 920, 498, 821, 880, 1578, 1605, 1362, 1307, 1417, 729, 1256, 961, 1203, 1146, 932, 1585, 1198, 1377, 500, 255, 822, 1551, 845, 1606, 1319, 1824, 1580, 741, 445, 1364, 471, 1418, 1119, 903, 730, 962, 1264, 1667, 1148, 1227, 936, 635, 825, 687, 1609, 1309, 851, 1205, 846, 446, 742, 1586, 1310, 1425, 732, 1378, 504, 826, 637, 475, 1229, 745, 1323, 1206, 799, 1420, 1368, 907, 853, 1610, 1559, 964, 1209, 1588, 1235, 1669, 1426, 487, 695, 1135, 1380, 944, 828, 638, 1230, 746, 1617, 1856, 1351, 867, 854, 477, 1612, 1325, 1441, 968, 1210, 1670, 1592, 753, 719, 1428, 909, 1384, 857, 748, 1618, 1237, 1795, 1920, 1183, 1331, 1563, 478, 699, 1326, 915, 491, 815, 1143, 910, 869, 1673, 1212, 383, 1251, 754, 1355, 858, 1238, 1575, 1442, 1333, 1633, 1432, 1241, 976, 1565, 1620, 870, 727, 1674, 1392, 701, 917, 493, 756, 1473, 860, 1797, 1444, 873, 1253, 1681, 1634, 1334, 1357, 1242, 499, 1415, 1147, 1566, 1199, 992, 1624, 1676, 931, 702, 918, 494, 1474, 1337, 1579, 760, 823, 1363, 731, 1358, 1254, 921, 874, 847, 1149, 1244, 1798, 501, 1257, 1338, 1682, 1607, 1448, 447, 1311, 743, 1636, 881, 933, 1581, 1801, 1419, 1365, 922, 827, 1207, 876, 1150, 1697, 733, 1476, 1587, 502, 1258, 1340, 1684, 882, 1456, 1640, 934, 1582, 1802, 1379, 963, 1231, 1366, 924, 505, 1265, 1698, 639, 1421, 734, 937, 1480, 1809, 1611, 1260, 829, 1369, 855, 747, 1211, 1589, 1427, 884, 1327, 506, 1381, 1422, 830, 1266, 1688, 965, 938, 479, 1804, 1370, 1648, 911, 1613, 1590, 1729, 749, 1239, 1671, 1700, 1213, 1810, 945, 859, 888, 508, 1382, 1429, 1593, 1488, 1268, 1619, 755, 966, 940, 1372, 1614, 1730, 750, 1825, 1385, 871, 969, 1214, 1704, 1812, 946, 1443, 1430, 1594, 1272, 1504, 1335, 861, 1567, 1732, 1826, 1243, 1675, 1621, 919, 757, 1433, 1386, 495, 703, 1359, 1255, 970, 862, 1596, 948, 875, 1393, 1635, 1445, 1622, 1245, 758, 1339, 1434, 1816, 977, 1712, 1388, 1677, 972, 1625, 1857, 761, 1828, 1394, 952, 923, 1736, 1446, 1799, 1151, 1475, 1683, 1246, 978, 1436, 877, 1637, 1259, 1678, 1583, 1449, 503, 1858, 1626, 1341, 762, 1367, 935, 1832, 1396, 993, 883, 1744, 925, 735, 878, 1638, 1342, 1685, 1261, 1477, 1450, 980, 1423, 1628, 1803, 1641, 764, 831, 926, 1267, 1371, 885, 1457, 1921, 507, 1400, 1591, 994, 1699, 1860, 939, 1686, 1262, 1478, 1452, 984, 1840, 1642, 1760, 1383, 1689, 1481, 1805, 886, 1458, 1922, 996, 1615, 1864, 1649, 967, 1269, 1373, 751, 509, 889, 1215, 1701, 941, 1811, 1644, 1690, 1482, 1806, 1431, 1595, 947, 1374, 1270, 1387, 1460, 942, 1650, 1702, 890, 510, 1731, 1489, 1273, 1000, 1924, 1692, 863, 971, 1597, 1813, 1623, 1484, 1705, 1872, 1435, 1464, 949, 1652, 759, 892, 1490, 1389, 1274, 1008, 1928, 1827, 1598, 1814, 1733, 1706, 1888, 1447, 1247, 973, 1395, 1505, 950, 1656, 1817, 1679, 1492, 1390, 1713, 1276, 1437, 1936, 1627, 953, 1734, 1708, 979, 1829, 974, 1506, 1639, 879, 763, 1343, 1438, 1397, 1818, 1737, 1451, 1714, 1629, 954, 1496, 927, 1830, 981, 1859, 1263, 1398, 1687, 1820, 1738, 1508, 765, 1833, 1716, 1952, 1479, 1630, 956, 1401, 1453, 1643, 995, 1745, 982, 887, 1740, 766, 1512, 1834, 1459, 1861, 1720, 985, 1984, 1402, 1454, 1746, 1841, 1691, 1645, 997, 1807, 1520, 1836, 1862, 986, 1483, 1375, 1271, 1761, 1404, 1923, 1703, 1651, 943, 1461, 1646, 891, 1693, 1865, 1485, 998, 1842, 1599, 1748, 1462, 511, 1653, 1275, 988, 1694, 1815, 1001, 1491, 1465, 1707, 1762, 893, 1866, 1486, 1391, 951, 1925, 1844, 1752, 1654, 1002, 1873, 1466, 1277, 1764, 894, 1735, 1439, 1657, 975, 1868, 1493, 1926, 1709, 1009, 1848, 1819, 1874, 1004, 1929, 1468, 1278, 1715, 1768, 1658, 955, 1507, 1494, 1710, 1010, 1831, 1399, 1631, 1739, 1821, 1497, 1717, 1889, 983, 1660, 1930, 1876, 1455, 1509, 957, 1822, 1835, 1498, 1741, 1403, 1937, 1012, 1890, 1718, 1776, 1932, 1510, 958, 1880, 1747, 1647, 1721, 767, 1500, 1742, 1863, 1938, 987, 1513, 1837, 1892, 1016, 1405, 1463, 1722, 1953, 999, 1843, 1695, 1749, 1940, 1514, 1838, 1896, 1406, 989, 1487, 1724, 1521, 1954, 1867, 1655, 1763, 1750, 1845, 1467, 1753, 1516, 1003, 990, 1869, 1944, 1846, 1927, 1522, 1711, 1765, 1659, 1904, 895, 1495, 1985, 1754, 1849, 1875, 1956, 1469, 1279, 1870, 1005, 1524, 1766, 1986, 1850, 1756, 1661, 1823, 1011, 1470, 1960, 1769, 1931, 1877, 1006, 1499, 1528, 1719, 1988, 1852, 1662, 1770, 1968, 1891, 1878, 1511, 1013, 1743, 1933, 1777, 959, 1992, 1881, 1501, 1772, 1939, 1014, 1723, 1934, 1839, 1893, 1882, 1515, 1502, 1778, 1751, 1941, 1725, 1017, 1894, 1407, 1884, 1897, 1847, 1780, 1517, 1955, 1942, 1726, 1018, 2000, 991, 1523, 1755, 1945, 1898, 1871, 1518, 1784, 1767, 1020, 1905, 1957, 2016, 1851, 1946, 1900, 1757, 1525, 1471, 1906, 1958, 1987, 1948, 1007, 1961, 1663, 1526, 1758, 1853, 1879, 1771, 1908, 1529, 1962, 1989, 1854, 1912, 1530, 1935, 1773, 1969, 1990, 1883, 1895, 1779, 1964, 1774, 1503, 1993, 1885, 1943, 1970, 1015, 1781, 1899, 1532, 1886, 1994, 1727, 1972, 1782, 1947, 2001, 1519, 1019, 1785, 1996, 1901, 1959, 1976, 2002, 1907, 1949, 1786, 1021, 1902, 1759, 2017, 1527, 2004, 1855, 1950, 1909, 1963, 1788, 1022, 2018, 2008, 1910, 1991, 1531, 1965, 2020, 1775, 1913, 1971, 1966, 2024, 1914, 1533, 1995, 1887, 1973, 1916, 2032, 1783, 1534, 1997, 1974, 1977, 2003, 1998, 1787, 1903, 1978, 2005, 1980, 1951, 1789, 1023, 2006, 2019, 1790, 2009, 1911, 2021, 2010, 2022, 2012, 1967, 2025, 1915, 2026, 2033, 1917, 2028, 1535, 2034, 1918, 1975, 2036, 2040, 1999, 1979, 1981, 1982, 2007, 1791, 2011, 2023, 2013, 2014, 2027, 2029, 2030, 1919, 2035, 2037, 2038, 2041, 2042, 2044, 1983, 2015, 2031, 2039, 2043, 2046, 2045, 2047.

In one configuration, an apparatus configured for polar coding (e.g., the wireless communication device 400 shown in FIG. 4) includes means for accessing a master sequence of bit locations maintained in order of reliability, where the master sequence is generated utilizing density evolution and nested over a code rate vector comprising a plurality of code rates having a same rate level, and the master sequence comprises a maximum length. The apparatus further includes means for generating a bit location sequence from the master sequence for an information block including a block length less than the maximum length, where the bit location sequence includes a number of bit locations corresponding to the block length arranged in order of reliability according to the master sequence. The apparatus further includes means for identifying information bit locations and frozen bit locations in the information block based on the bit location sequence, means for placing information bits in the information bit locations of the information block and frozen bits in the frozen bit locations of the information block, means for polar coding the information block to produce a polar codeword, and means for transmitting the polar codeword to a receiving wireless communication device over a wireless air interface In one aspect, the aforementioned means may be the processor(s) 404 FIG. 4 configured to perform the functions recited by the aforementioned means. For example, the aforementioned means may include the polar encoder 441 shown in FIG. 4, the polar encoder 320 shown in FIG. 3, and/or the polar encoder 520 shown in FIG. 5. In another aspect, the aforementioned means may be a circuit or any apparatus configured to perform the functions recited by the aforementioned means.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in FIGS. 1-11 may be rearranged and/or combined into a single component, step, feature or function or embodied in several components, steps, or functions. Additional elements, components, steps, and/or functions may also be added without departing from novel features disclosed herein. The apparatus, devices, and/or components illustrated in FIGS. 1-6 may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

What is claimed is:

1. A method of polar coding at a transmitting wireless communication device, comprising:
    accessing a master sequence of final bit locations maintained in order of reliability, wherein the master sequence is generated utilizing density evolution and nested over a code rate vector comprising a plurality of code rates having a same rate level, wherein the master sequence comprises a maximum length;
    generating a bit location sequence from the master sequence for an information block comprising a block length less than the maximum length, wherein the bit location sequence comprises a number of the final bit locations corresponding to the block length arranged in order of reliability according to the master sequence;
    identifying information bit locations and frozen bit locations in the information block based on the bit location sequence;
    placing information bits in the information bit locations of the information block and frozen bits in the frozen bit locations of the information block;
    polar coding the information block to produce a polar codeword; and
    transmitting the polar codeword to a receiving wireless communication device over a wireless air interface.

2. The method of claim 1, wherein identifying the information bit locations and the frozen bit locations in the information block further comprises:
    identifying a first number of original bit locations of the information block as the information bit locations based on a code rate and the bit location sequence; and
    identifying a remaining number of the original bit locations of the information block as the frozen bit locations;
    wherein each of the information bit locations has a higher reliability than each of the frozen bit locations based on the bit location sequence.

3. The method of claim 2, wherein the final bit locations comprise each of the original bit locations of the information block, and wherein generating the bit location sequence from the master sequence for the information block further comprises:
    selecting each of the original bit locations from the master sequence in order to produce the bit location sequence, wherein the original bit locations are arranged in the order of reliability of the master sequence in the bit location sequence.

4. The method of claim 1, wherein identifying the information bit locations and the frozen bit locations in the information block further comprises:

generating an initial puncturing pattern comprising initial punctured bit locations for puncturing corresponding coded bit locations in the polar codeword;

performing bit-reversal permutation on the initial puncturing pattern to produce a final puncturing pattern comprising final punctured bit locations;

placing frozen bits in the final punctured bit locations of the information block; and identifying the information bit locations and the frozen bit locations in the information block from non-punctured bit locations in the information block based on the bit location sequence.

5. The method of claim 1, wherein the master sequence comprises a first final bit location comprising a highest reliability and a last final bit location comprising a lowest reliability.

6. The method of claim 1, wherein the master sequence comprises a first final bit location comprising a lowest reliability and a last final bit location comprising a highest reliability.

7. An apparatus configured for polar coding, the apparatus comprising:
a processor;
a memory communicatively coupled to the processor and configured to store a master sequence of final bit locations maintained in order of reliability, wherein the master sequence is generated utilizing density evolution and nested over a code rate vector comprising a plurality of code rates having a same rate level, wherein the master sequence comprises a maximum length; and
a transceiver communicatively coupled to the processor, wherein the processor is configured to:
generate a bit location sequence from the master sequence for an information block comprising a block length less than the maximum length, wherein the bit location sequence comprises a number of the final bit locations corresponding to the block length arranged in order of reliability according to the master sequence;
identify information bit locations and frozen bit locations in the information block based on the bit location sequence;
place information bits in the information bit locations of the information block and frozen bits in the frozen bit locations of the information block;
polar code the information block to produce a polar codeword; and
transmit the polar codeword to a receiving wireless communication device via the transceiver over a wireless air interface.

8. The apparatus of claim 7, wherein the processor is further configured to:
identify a first number of original bit locations of the information block as the information bit locations based on a code rate and the bit location sequence; and
identify a remaining number of the original bit locations of the information block as the frozen bit locations;
wherein each of the information bit locations has a higher reliability than each of the frozen bit locations based on the bit location sequence.

9. The apparatus of claim 8, wherein the final bit locations comprise each of the original bit locations of the information block, and wherein the processor is further configured to:
select each of the original bit locations from the master sequence in order to produce the bit location sequence, wherein the original bit locations are arranged in the order of reliability of the master sequence in the bit location sequence.

10. The apparatus of claim 7, wherein the processor is further configured to:
generate an initial puncturing pattern comprising initial punctured bit locations for puncturing corresponding coded bit locations in the polar codeword;
perform bit-reversal permutation on the initial puncturing pattern to produce a final puncturing pattern comprising final punctured bit locations;
place frozen bits in the final punctured bit locations of the information block; and
identify the information bit locations and the frozen bit locations in the information block from non-punctured bit locations in the information block based on the bit location sequence.

11. The apparatus of claim 7, wherein the master sequence comprises a first final bit location comprising a highest reliability and a last final bit location comprising a lowest reliability.

12. The apparatus of claim 7, wherein the master sequence comprises a first final bit location comprising a lowest reliability and a last final bit location comprising a highest reliability.

13. An apparatus configured for polar coding, the apparatus comprising:
means for accessing a master sequence of final bit locations maintained in order of reliability, wherein the master sequence is generated utilizing density evolution and nested over a code rate vector comprising a plurality of code rates having a same rate level, wherein the master sequence comprises a maximum length;
means for generating a bit location sequence from the master sequence for an information block comprising a block length less than the maximum length, wherein the bit location sequence comprises a number of the final bit locations corresponding to the block length arranged in order of reliability according to the master sequence;
means for identifying information bit locations and frozen bit locations in the information block based on the bit location sequence;
means for placing information bits in the information bit locations of the information block and frozen bits in the frozen bit locations of the information block;
means for polar coding the information block to produce a polar codeword; and
means for transmitting the polar codeword to a receiving wireless communication device over a wireless air interface.

14. The apparatus of claim 13, wherein the means for identifying the information bit locations and the frozen bit locations in the information block further comprises:
means for identifying a first number of original bit locations of the information block as the information bit locations based on a code rate and the bit location sequence; and
means for identifying a remaining number of the original bit locations of the information block as the frozen bit locations;
wherein each of the information bit locations has a higher reliability than each of the frozen bit locations based on the bit location sequence.

15. The apparatus of claim 14, wherein the final bit locations comprise each of the original bit locations of the information block, and wherein the means for generating the bit location sequence from the master sequence for the information block further comprises:
  means for selecting each of the original bit locations from the master sequence in order to produce the bit location sequence, wherein the original bit locations are arranged in the order of reliability of the master sequence in the bit location sequence.

16. The apparatus of claim 13, wherein the means for identifying the information bit locations and the frozen bit locations in the information block further comprises:
  means for generating an initial puncturing pattern comprising initial punctured bit locations for puncturing corresponding coded bit locations in the polar codeword;
  means for performing bit-reversal permutation on the initial puncturing pattern to produce a final puncturing pattern comprising final punctured bit locations;
  means for placing frozen bits in the final punctured bit locations of the information block; and
  means for identifying information bit locations and frozen bit locations in the information block from non-punctured bit locations in the information block based on the bit location sequence.

17. The apparatus of claim 13, wherein the master sequence comprises a first final bit location comprising a highest reliability and a last final bit location comprising a lowest reliability.

18. The apparatus of claim 13, wherein the master sequence comprises a first final bit location comprising a lowest reliability and a last final bit location comprising a highest reliability.

19. A non-transitory computer-readable medium storing computer executable code executed by a processor, comprising code for:
  accessing a master sequence of final bit locations maintained in order of reliability, wherein the master sequence is generated utilizing density evolution and nested over a code rate vector comprising a plurality of code rates having a same rate level, wherein the master sequence comprises a maximum length;
  generating a bit location sequence from the master sequence for an information block comprising a block length less than the maximum length, wherein the bit location sequence comprises a number of the final bit locations corresponding to the block length arranged in order of reliability according to the master sequence;
  identifying information bit locations and frozen bit locations in the information block based on the bit location sequence;
  placing information bits in the information bit locations of the information block and frozen bits in the frozen bit locations of the information block;
  polar coding the information block to produce a polar codeword; and
  transmitting the polar codeword to a receiving wireless communication device over a wireless air interface.

20. The non-transitory computer-readable medium of claim 19, further comprising code for:
  identifying a first number of original bit locations of the information block as the information bit locations based on a code rate and the bit location sequence; and
  identifying a remaining number of the original bit locations of the information block as the frozen bit locations;
  wherein each of the information bit locations has a higher reliability than each of the frozen bit locations based on the bit location sequence.

21. The non-transitory computer-readable medium of claim 20, wherein the final bit locations comprise each of the original bit locations of the information block, and further comprising code for:
  selecting each of the original bit locations from the master sequence in order to produce the bit location sequence, wherein the original bit locations are arranged in the order of reliability of the master sequence in the bit location sequence.

22. The non-transitory computer-readable medium of claim 19, further comprising code for:
  generating an initial puncturing pattern comprising initial punctured bit locations for puncturing corresponding coded bit locations in the polar codeword;
  performing bit-reversal permutation on the initial puncturing pattern to produce a final puncturing pattern comprising final punctured bit locations;
  placing frozen bits in the final punctured bit locations of the information block; and
  identifying information bit locations and frozen bit locations in the information block from non-punctured bit locations in the information block based on the bit location sequence.

23. The non-transitory computer-readable medium of claim 19, wherein the master sequence comprises a first final bit location comprising a highest reliability and a last final bit location comprising a lowest reliability.

24. The non-transitory computer-readable medium of claim 19, wherein the master sequence comprises a first final bit location comprising a lowest reliability and a last final bit location comprising a highest reliability.

* * * * *